United States Patent [19]
Mitani et al.

[11] Patent Number: 6,018,185
[45] Date of Patent: Jan. 25, 2000

[54] SEMICONDUCTOR DEVICE WITH ELEMENT ISOLATION FILM

[75] Inventors: Yuichiro Mitani; Ichiro Mizushima, both of Yokohama; Shigeru Kambayashi; Iwao Kunishima, both of Kawasaki; Masahiro Kashiwagi, Yokohama, all of Japan

[73] Assignee: Kabushiki Kaisha Toshiba, Kawasaki, Japan

[21] Appl. No.: 08/861,218

[22] Filed: May 21, 1997

[30] Foreign Application Priority Data

May 22, 1996 [JP] Japan ................................. 8-126802

[51] Int. Cl.[7] .................................................. H01L 29/76
[52] U.S. Cl. .......................... 257/374; 257/395; 257/396; 257/397; 257/398
[58] Field of Search ..................... 438/300, 301, 438/299, 306; 257/374, 395, 396, 397, 398

[56] References Cited

U.S. PATENT DOCUMENTS

| | | | |
|---|---|---|---|
| 3,849,216 | 11/1974 | Salters | 148/187 |
| 4,224,733 | 9/1980 | Spadea | 29/571 |
| 4,384,301 | 5/1983 | Tasch, Jr. et al. | 357/23 |
| 4,504,333 | 3/1985 | Kurosawa | 148/187 |
| 4,697,199 | 9/1987 | De Graaff et al. | 357/23.13 |
| 4,918,510 | 4/1990 | Pfiester | 357/42 |
| 5,777,370 | 7/1998 | Omid-Zohoor et al. | 257/374 |
| 5,789,792 | 8/1998 | Tsutumi | 257/506 |

FOREIGN PATENT DOCUMENTS

| | | | |
|---|---|---|---|
| 355052270 | 4/1980 | Japan | 257/396 |
| 355154769 | 12/1980 | Japan | 257/396 |
| 361204958 | 9/1986 | Japan | 257/398 |
| 404240765 | 8/1992 | Japan | 257/374 |
| 406061484 | 3/1994 | Japan | 257/398 |
| 8-139175 | 5/1996 | Japan . | |
| 8-139313 | 5/1996 | Japan . | |

*Primary Examiner*—William Mintel
*Attorney, Agent, or Firm*—Oblon, Spivak, McClelland, Maier & Neustadt, P.C.

[57] ABSTRACT

The semiconductor device comprises a semiconductor substrate having an element region, an element isolation film formed on the semiconductor substrate so as to surround the element region, a gate portion crossing the element region and extending over the semiconductor substrate, the gate portion comprising at least a gate insulation film formed on the semiconcuctor substrate and a gate electrode formed on the gate insulation film, and source/drain regions formed on the surface of the element regions on both sides of the gate portion, wherein an upper surface of the element isolation film is formed in substantially the same plane as an upper surface of the gate portion.

11 Claims, 34 Drawing Sheets

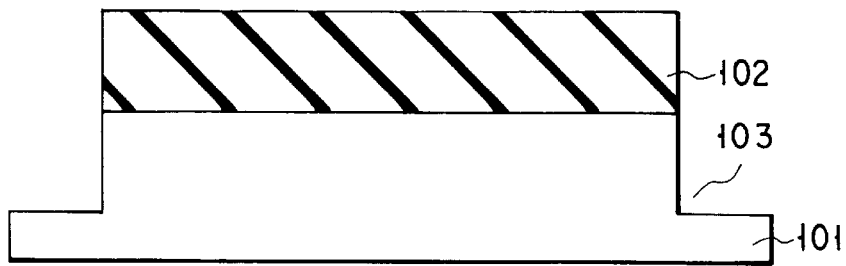
F I G. 2A
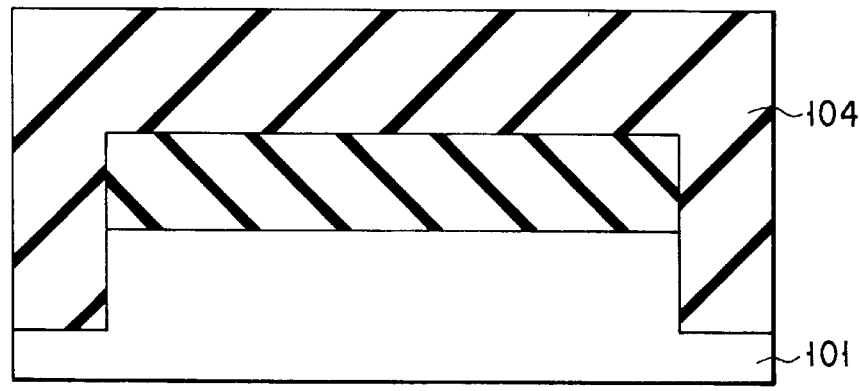
F I G. 2B
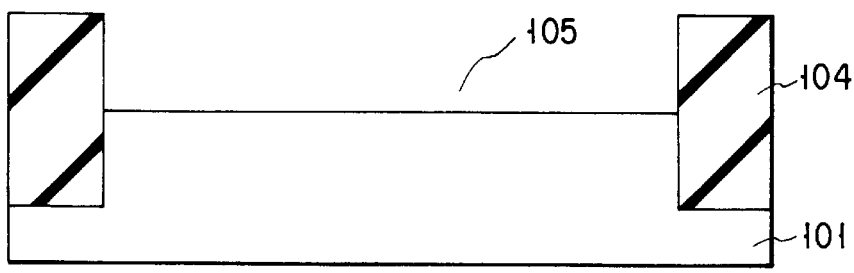
F I G. 2C
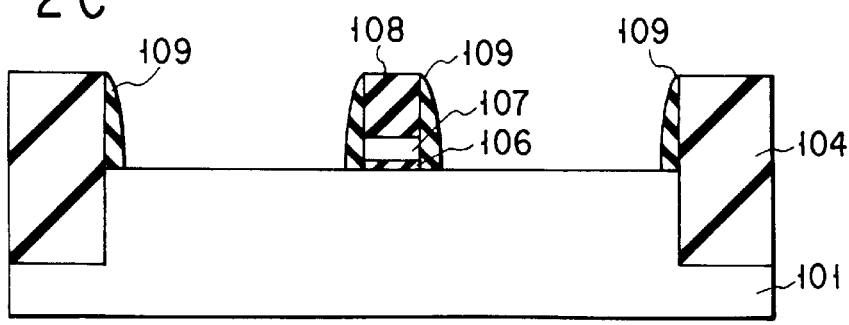
F I G. 2D

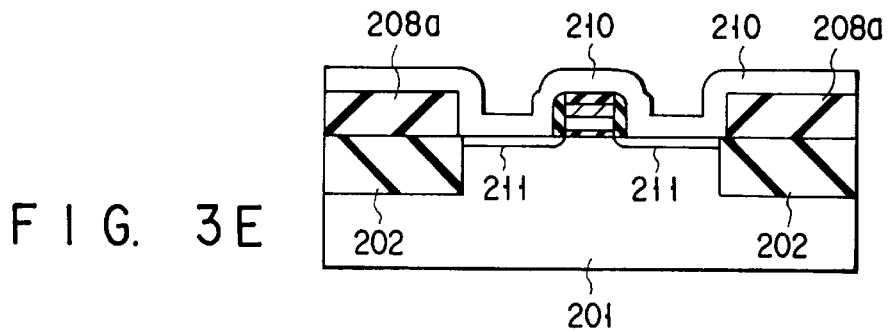
F I G. 3E
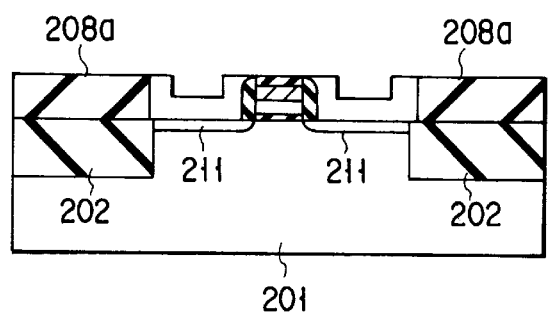
F I G. 3F
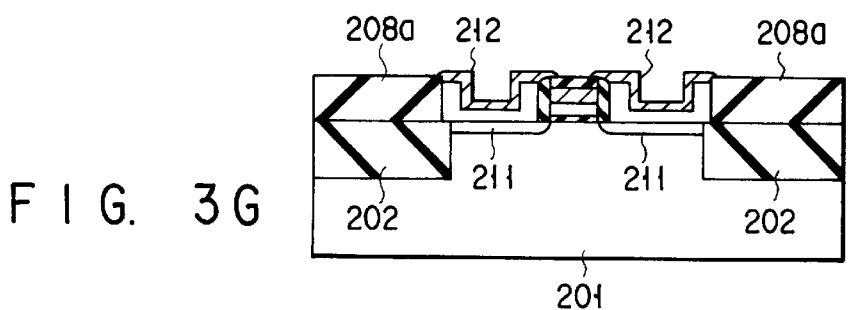
F I G. 3G
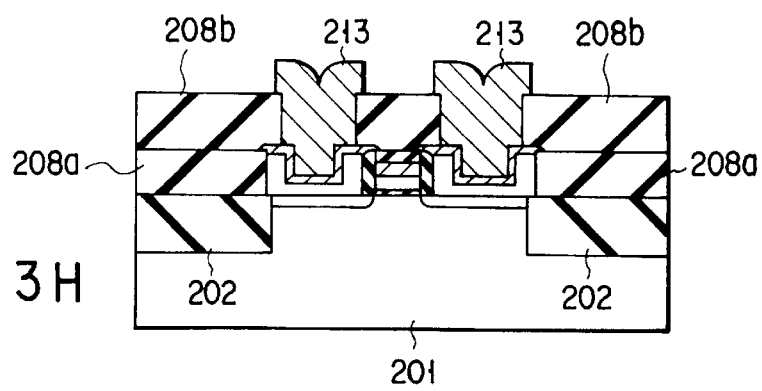
F I G. 3H

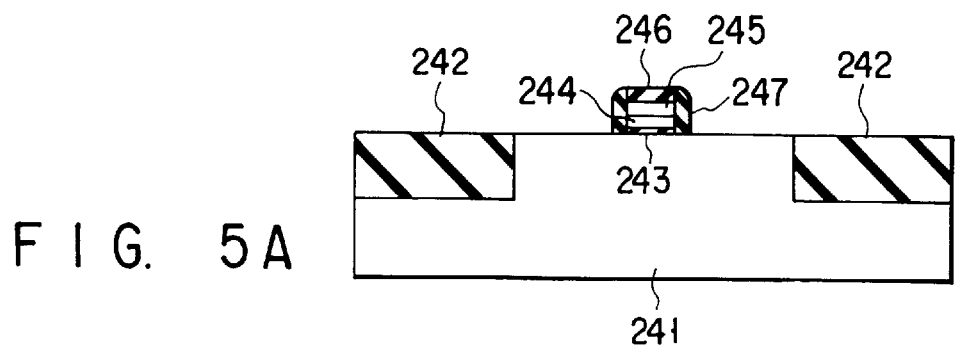
F I G. 5A
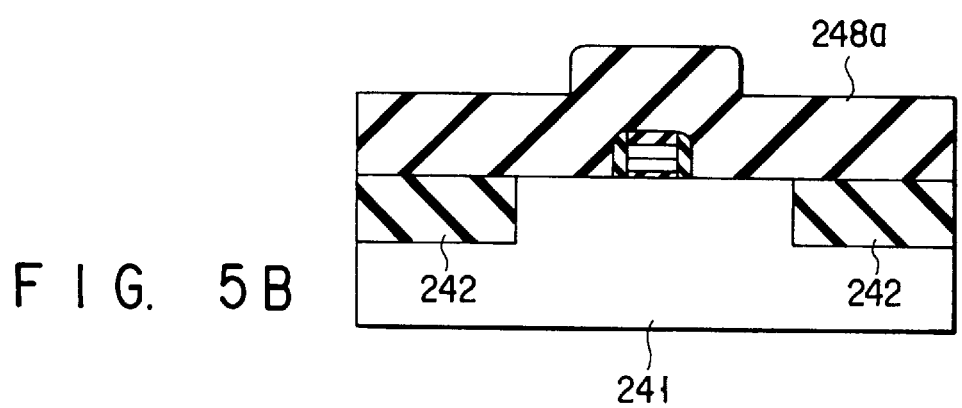
F I G. 5B
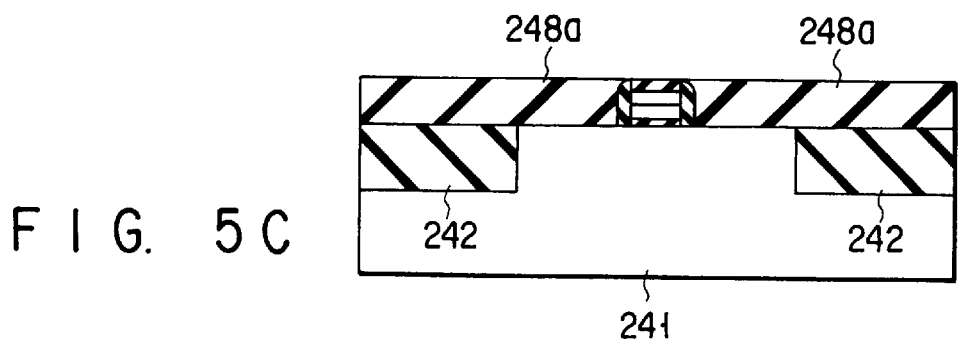
F I G. 5C
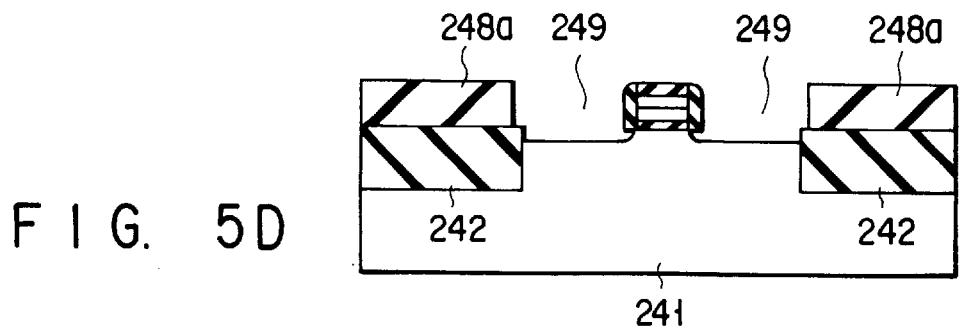
F I G. 5D

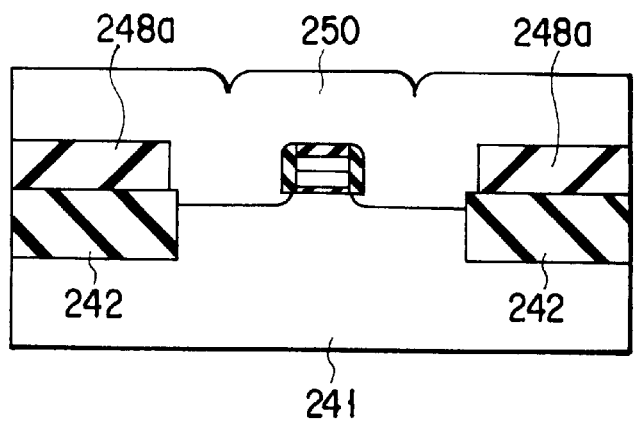
F I G. 5E
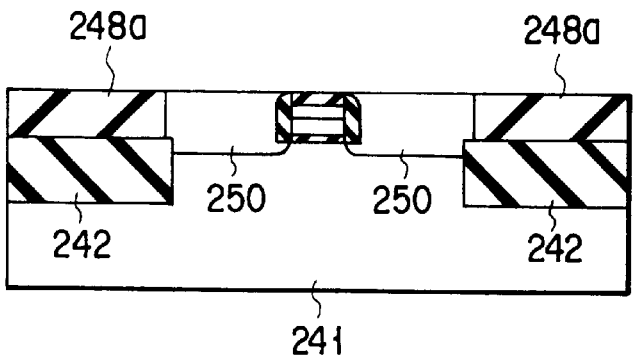
F I G. 5F
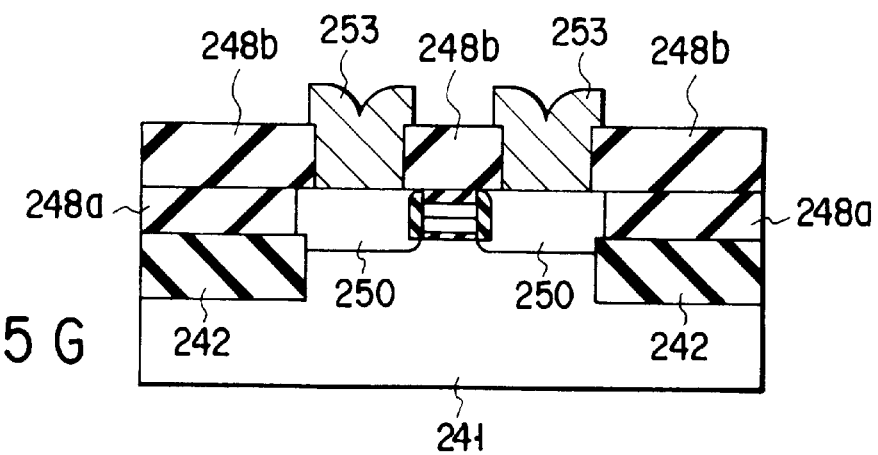
F I G. 5G

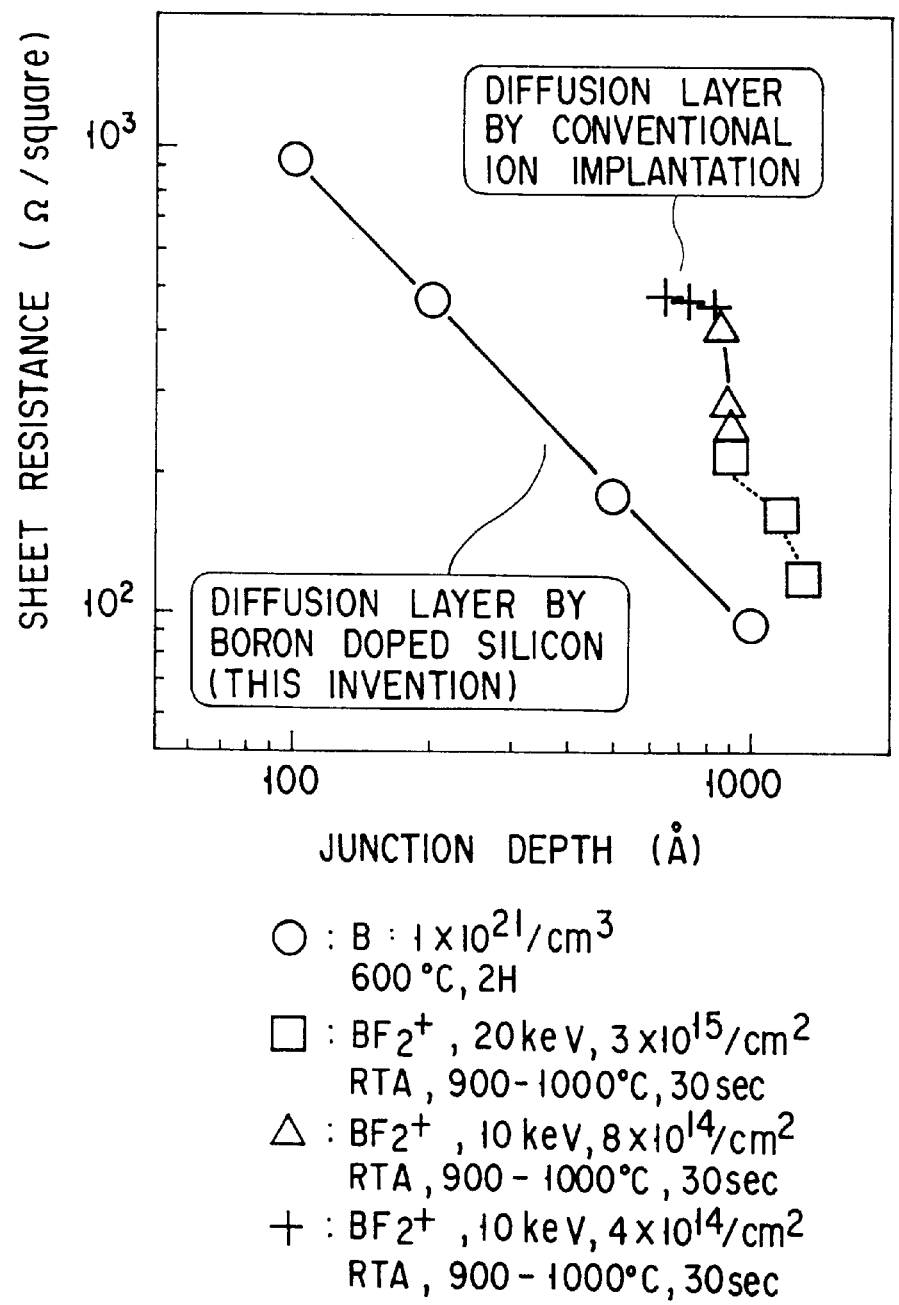
F I G. 6

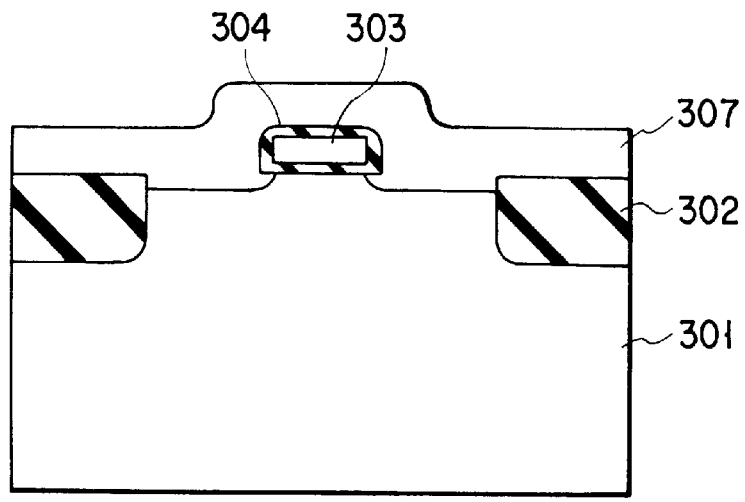
F I G. 8A
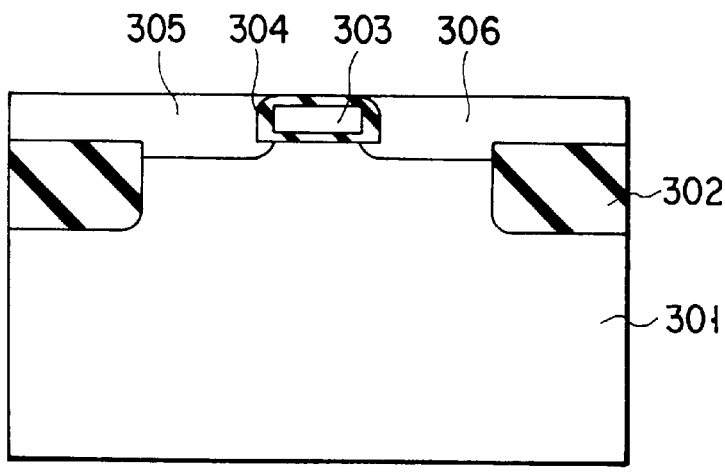
F I G. 8B

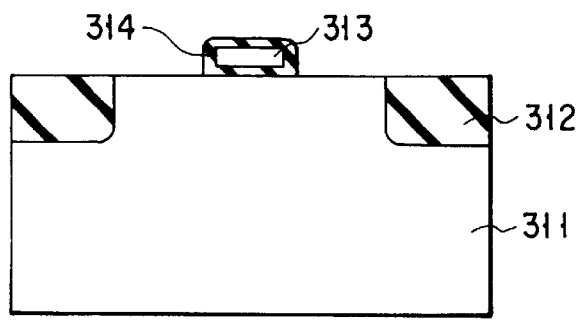
F I G. 9A
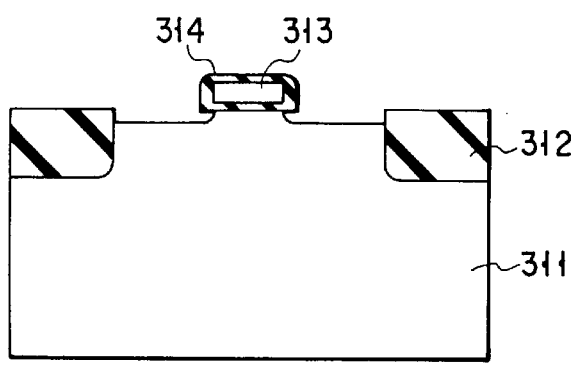
F I G. 9B
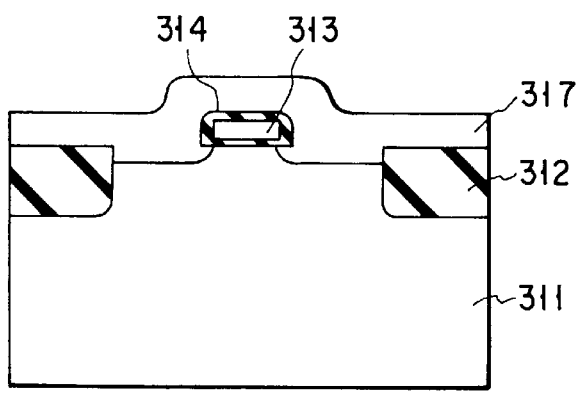
F I G. 9C
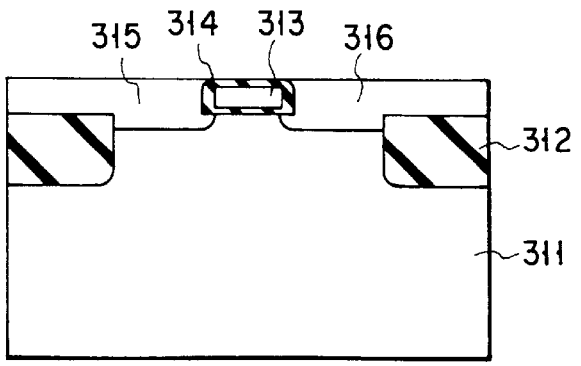
F I G. 9D

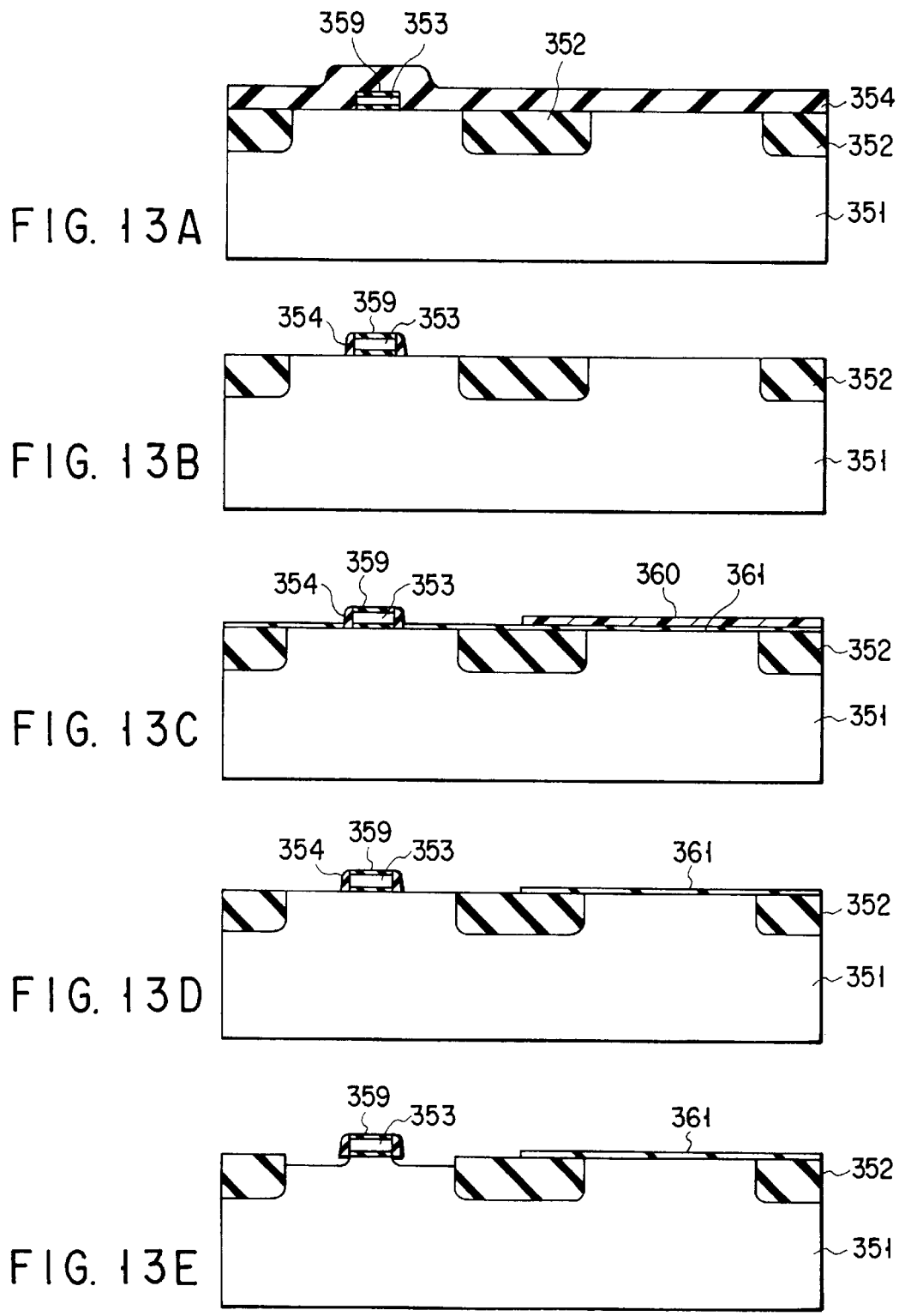

SEMICONDUCTOR DEVICE WITH ELEMENT ISOLATION FILM

BACKGROUND OF THE INVENTION

The present invention relates to a semiconductor device having a MOS transistor structure and a method of manufacturing the same.

With a recent increase in the integration density of semiconductor devices, miniaturization of the elements has been accelerated. However, with the miniaturization of the device, various problems have been raised. For example, when an MOS transistor is miniaturized, the junction depth of a source/drain diffusion layer is reduced, with the result that the sheet resistance of the source/drain diffusion layer rapidly increases and the operation rite thus significantly decreases.

To describe this problem more specifically, when a source/drain diffusion layer (0.2 μm in depth) is formed by diffusing impurity ions in a concentration of $1 \times 10^{20} cm^{-3}$, the sheet resistance becomes as large as 100 ohm/square or more. To solve the problem, a so-called SALICIDE (Self-aligned Silicide) technique has been intensively studied in recent years.

FIG. 1 is a cross sectional view of a conventional MOS transistor formed by the SALICIDE technique. The steps of manufacturing the MOS transistor will be explained below in the order of manufacturing. An element isolation film ($SiO_2$ film) 801 is first formed selectively on a silicon substrate 800 by a well-known LOCOS method. Subsequently, a gate Insulation film 811, a gate electrode 802, an upper gate-insulation film 809, and a side wall gate-insulation film 810 are formed, and a shallow source/drain diffusion layer 803 (0.15 μm in depth) is formed by ion implantation.

After a Ti film (30 nm) is deposited over the entire surface of the resultant structure by sputtering, the substrate is subjected to heat treatment called a rapid thermal annealing (RTA) in a nitrogen atmosphere for 30 seconds at 700° C. As a result, a $TiSi_2$ film 804 is formed between the source/drain diffusion layer 803 and the Ti film.

The Ti film remaining unreacted on an insulation film including the element isolation film 801 is selectively removed with a mixed solution of sulfuric acid and hydrogen peroxide. Subsequently, an interlayer insulation film ($SiO_2$ film) 805 is formed over the entire surface of the resultant structure.

After a contact hole is made in the interlayer insulation film 805, a buried electrode 806, an upper electrode wiring layer 807, and an upper insulation film ($SiO_2$ film)808 are formed. The MOS transistor is thereby manufactured.

As is described above, by virtue of the presence of the $TiSi_2$ film 804 formed on the source/drain diffusion film 803, the source/drain region exhibits a sheet resistance of 5 ohm/square. This sheet resistance is 1/20 or less of the sheet resistance of the source/drain region in the absence of the $TiSi_2$ film 804. Therefore, the formation of the $TiSi_2$ film contributes to a decrease in the sheet resistance, ensuring the high speed operation of a miniaturized semiconductor device.

However, as the results of the intensive studies on the SALICIDE technique, the presence of the following problems have been confirmed. When the gate length becomes 0.2 μm or less with the miniaturization, the depth of the source/drain diffusion layer must be set as shallow as 0.1 μm or less, to suppress the short channel effect.

When the source/drain diffusion layer 803 is formed shallow, it is destroyed to increase a junction leakage. This is because Si is consumed when the source/drain diffusion layer 803 (Si) reacts with the Ti film to form an alloy ($TiSi_2$) film 804.

To prevent an increase of the junction leakage, it is effective to reduce the Si consumption by reducing the thickness of $TiSi_2$ film 804. If the Si consumption is reduced, the sheet resistance of the source/drain region inevitably increases, making it difficult to attain the anticipated object, an improvement of the operation rate.

The source/drain diffusion layer 803 is usually formed by ion implantation. For example, $BF_2^+$ ions are implanted at 10 keV in a dose of $8 \times 10^{14}$ atoms/cm² and subjected to heat treatment for 30 minutes at 900° C. In this manner, the source/drain diffusion layer 803 can be formed with a depth of about 0.09 nm. The depth is defined as the distance from the surface of the substrate to a position where a boron concentration is $1 \times 10^{17}$ atoms/cm³.

However, the ion implantation method has problems. There is a limitation in lowering the implantation speed. A profile changes at the time of implantation and activation of the ions. Hence, the shallow source/drain diffusion layer with a low resistance cannot be formed without limitation.

To deal with this problem, a technique has been recently proposed comprising the steps of absorbing an impurity such as boron in a substrate or depositing a thin film containing an impurity on a substrate, and diffusing the impurity into the substrate by a brief heat treatment performed at a high-temperature, thereby forming the shallow source/drain diffusion layer with a low resistance. However, this method requires a technique for adsorbing an impurity or depositing the impurity-containing thin film selectively to a desired region.

In the case of the ion implantation, impurity ions can be selectively injected only into a desired source/drain formation region by using a resist as a mask. However, it is extremely difficult to isolate and process the impurity-adsorbing region or an impurity-containing thin film formed on a gate electrode by use of the resist mask since the gate electrode is formed in the lowermost dimensions. In the regions other than the region on the gate electrode, a sufficient margin must be maintained to compensate for a lithographic misalignment relative to the proximity of the gate electrode, for example, to the source/drain region. Therefore, in the ion implantation method, techniques are also required for selectively absorbing an impurity and for selectively depositing a thin film.

As one of the selective deposition techniques, known is a technique for depositing the impurity-containing thin silicon film by thermally decomposing a mixed gas consisting of a source gas containing a silicon material (e.g. dichlorsilane or a silane gas) and an impurity-containing gas, (e.g. a di-borane gas).

However, such a selective deposition technique has the following problems:

Deposition must be performed at a relatively high temperature;

The deposited thin silicon film is epitaxially grown;

The gas used herein is limited in type; and

Gas-flow amount, temperature, atmosphere and the like defining the deposition selectivity are limited to narrow ranges.

The selective deposition technique is not an established technique as mentioned above and may therefore affect the reliability of the transistor characteristics.

To sum up, in the conventional SELICIDE technique, there is a problem in that a junction leakage increases as the junction depth of source/drain diffusion layer becomes shallow since the source/drain diffusion layer is destroyed due to the Si consumption of the source/drain diffusion layer at the time the silicide film is formed.

As one of techniques for forming a shallow source/drain diffusion layer except for the ion implantation, known is a method enabling selective depositing of an impurity-containing thin silicon film. However, this method is not suitable in practice because a process temperature is relatively high, the gas-flow amount, temperature, atmosphere, and the like are limited to narrow ranges.

BRIEF SUMMARY OF THE INVENTION

An object of the present invention is to effectively provide a semiconductor device having a miniaturized source/drain region, and a method of manufacturing the same.

To attain the aforementioned object, a semiconductor device according a first aspect of the present invention comprises a semiconductor substrate having an element region;

an element isolation film formed on the semiconductor substrate so as to surround the element region;

a gate portion crossing the element region and extending over the semiconductor substrate, the gate portion comprising at least a gate insulation film formed on the semiconductor substrate and a gate electrode formed on the gate insulation film; and source/drain regions formed in the surface of the element region on both sides of the cate portion, wherein an upper surface of the element isolation film is formed in substantially the same plane as an upper surface of the gate portion.

In the present invention, when the gate electrode is formed of a polycrystalline silicon, and the gate portion further comprises a refractory metal film on the gate electrode, an upper surface of the refractory metal film is formed in substantially the same plane as the upper surface of the element isolation film.

When the gate portion further comprises an upper insulation film on the gate electrode, the upper surface of the upper insulation film is in substantially the same plane as the upper surface of the element isolation film.

The gate portion is preferred to further comprise a side-wall insulation film covering a side wall of the gate portion.

The semiconductor device of the present invention further may comprise a conductive film formed on each of the source/drain regions surrounded with the gate portion and the element isolation film. It is preferable that the conductive film be electrically isolated from the gate electrode by the side wall insulation film.

In this case, at least part of the conductive film is formed in substantially the same plane as the upper surface of the gate portion.

An interlayer insulation film may be formed on the conductive film. An upper surface of the interlayer insulation region may be formed in substantially the same plane as an upper surface of the element isolation film.

When the semiconductor substrate is a single crystal semiconductor substrate, the conductive film may be an epitaxially-grown film made of an alloy of a semiconductor constituting the semiconductor substrate and a transition metal.

When the semiconductor substrate is formed of silicon, the conductive film may be formed of silicon containing an impurity, and the concentration of the impurity contained in the conductive film is preferably larger than the solid solubility of silicon.

The semiconductor device according to a second aspect of the present invention comprises a semiconductor substrate having an element isolation region;

an element isolation region formed on the semiconductor substrate so as to surround the element region;

a gate portion crossing the element region and extending over the semiconductor substrate, the gate portion comprising a gate insulation film formed on the semiconductor substrate, a gate electrode formed on the gate insulation film, an upper insulation film formed on the gate electrode, and a side-wall insulation film formed on the side-wall of the gate electrode; and source/drain regions formed in a surface of the element regions on both sides of the gate portion;

wherein an upper surface of the element isolation film and at least part of upper surfaces of the source/drain regions are formed in substantially the same plane as upper surface of the gate portion.

In the semiconductor device of the present invention, the semiconductor substrate is formed of silicon, the source/drain regions are formed of silicon containing an impurity, and a concentration of the impurity contained in the source/drain regions is larger than the solid solubility of silicon.

The element isolation region may be formed of a construct having the same structure as that of the gate portion, formed on an insulation film.

A method of manufacturing semiconductor device according to a third aspect of the present invention comprises the steps of forming an element isolation film on a semiconductor substrate so as to project from the semiconductor substrate to form an element region surrounded with the element isolation film;

forming a gate portion on the semiconductor substrate of the element region in such a manner that an upper surface of the gate portion is formed in substantially the same plane as an upper surface of the element isolation film;

forming a pair of source/drain diffusion layers mutually opposed with the gate portion interposed therebetween, on a surface of the semiconductor substrate in the element region;

forming a conductive film on an entire surface of the substrate so as to be in contact with a pair of source/drain diffusion layers; and burying the conductive film between the element isolation film and the gate portion by polishing the conductive film after the step of forming the conductive film.

The step of forming a gate portion may comprise the steps of forming a gate insulation film on the semiconductor substrate;

forming a first gate electrode on the gate insulation film;

forming an upper insulation film on the first gate electrode; and forming a side-wall insulation film on a side face of the first gate electrode.

After the upper insulation film is removed, a second gate electrode may be buried in the upper insulation film removed portion.

The conductive film is preferred to be formed of an amorphous silicon. The step of forming the conductive film preferably comprises a single-crystallization step of the amorphous silicon with heat treatment.

The conductive film may include a transition metal. The step of forming the conductive film comprises a step of epitaxially growing an alloy of a semiconductor constituting the semiconductor substrate and the transition metal.

A method of manufacturing a semiconductor device according to a fourth aspect of the present invention comprising the steps of forming a gate portion on a semiconductor substrate;

forming an insulation film on an entire surface of the substrate so as to cover the gate portion;

flattening the insulation film to a height of the gate portion;

forming an opening portion in the insulation film to expose a surface of the semiconductor substrate in the source/drain layer formation region;

forming a conductive film over the entire surface; and leaving the conductive film in the opening.

The conductive film may be formed of an amorphous silicon containing an impurity. The step of forming the conductive film comprises a single-crystallization step of the amorphous silicon with heat treatment.

Alternatively, the conductive film may be formed of silicon containing an impurity, the step of forming an opening in the insulation film may comprise a step of forming a depressed portion by etching the surface of the semiconductor substrate of a bottom of the opening portion, and the step of forming a conductive film over the entire surface may comprise a step of forming the silicon layer containing an impurity so as to bury it in the depressed portion.

The step of leaving the conductive film may comprise a step of leaving the silicon layer at least in the depressed portion.

If the structure of the first aspect of the present invention is employed, the conductive film for reducing the resistance of the source/drain region can be buried by polishing in a self-alignment manner according to a third aspect of the present invention. Since silicon of the source drain diffusion layer is not needed to react with a refractory metal, while it is needed in the prior art, the silicon of the source/drain diffusion layer is not eroded in theory. By virtue of this feature, the resistance of the source/drain region can be sufficiently reduced by the conductive film of the present invention even if the junction of source/drain diffusion layer is shallow.

According to the method of manufacturing a semiconductor device according to the fourth aspect of the present invention, the conductive film is left selectively within the opening (source/drain region) for example, by polishing after the conductive film is formed over the entire surface. Hence, compared to the conventional selective deposition technique, the semiconductor film or the like can be formed in the source/drain region by a method with less limitation. Furthermore, if the semiconductor film containing an impurity is used as the conductive film, the source/drain layer can be formed by diffusing the impurity in the semiconductor substrate with heat. Since a concentration profile of the impurity can be controlled well in this method, the impurity can be doped into the surface of the semiconductor substrate so as to be shallow and in a high concentration. As a result, a and low resistant source/drain layer can be formed.

The step of leaving the semiconductor film or the like selectively in the opening can be performed in a self-aligning manner by polishing the semiconductor film formed over the entire surface. In this way, even if the gate has a length of the lowermost processing dimensions, the semiconductor film or the like can be separated on the gate portion without fail.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A–2L are cross sectional views of an MOS transistor, sequentially showing the steps of manufacturing the MOS transistor according to Embodiment 1 of the present invention;

FIGS. 3A–3H are cross sectional views of an MOS transistor, sequentially showing the steps of manufacturing the MOS transistor according to Embodiment 2 of the present invention;

FIGS. 5A–5G are cross sectional views of an MOS transistor, sequentially showing the steps of manufacturing the MOS transistor according to Embodiment 4 of the present invention;

FIG. 6 is a graph showing the relationship between the junction depth and the sheet resistance in the boron-doped silicon diffusion layers of the present invention in comparison with the diffusion layer formed by a conventional ion implantation method;

FIGS. 8A and 8B are cross sectional views of an MOS transistor, showing a manufacturing method of an MOS transistor according to Embodiment 5 of the present invention, in two steps;

FIGS. 9A–9D are cross sectional views of an MOS transistor, sequentially showing the steps of manufacturing the MOS transistor according to Embodiment 6 of the present invention;

DETAILED DESCRIPTION OF THE INVENTION

Figure 1:
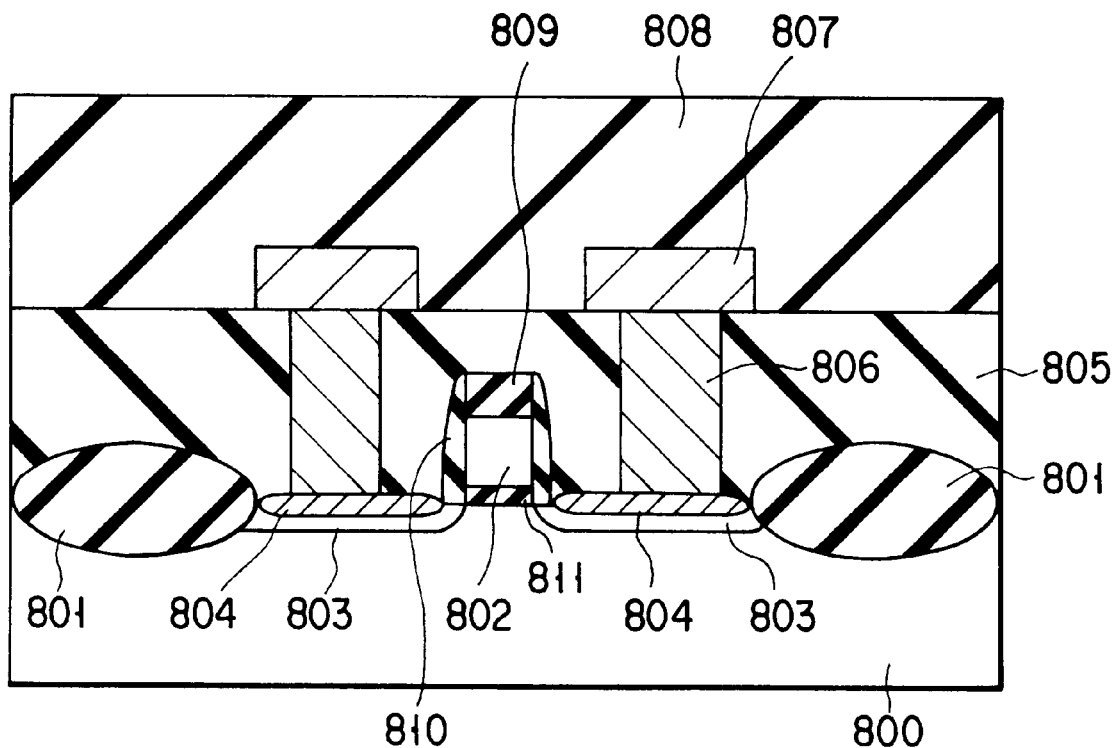
FIG. 1 is a cross sectional view of an MOS transistor formed by a conventional SALICIDE technique.

Hereinbelow, Embodiments of the present invention will be explained with reference to the accompanying drawings.
(Embodiment 1)

FIGS. 2A–2L are cross sectional views of an MOS transistor, sequentially showing the steps of manufacturing the MOS transistor according to Embodiment 1 of the present invention.

As shown in FIG. 2A, a mask pattern 102 (0.3 μm-thick) made of a silicon nitride film ($Si_3N_4$ film) is formed on a <100> plane of a single crystal silicon substrate 101. The mask pattern 102 thus-formed is used for forming a buried isolation film which defines an element region of a transistor. Thereafter, the silicon substrate 101 is etched by using the mask pattern 102 as a mask. As a result, an isolation groove 103 (0.3 μm depth) is formed on the surface of the substrate.

As shown in FIG. 2B, a $SiO_2$ film 104 (about 1.5 μm thick) serving as the buried isolation film is then formed over the entire surface. The $SiO_2$ film 104 is formed by the CVD (chemical vapor deposition) method using a gas mixture of, for example, a TEOS (tetraethylorthosilicate) gas and an ozone ($O_3$) gas.

As shown in FIG. 2C, the $SiO_2$ film 104 is polished by the CMP (Chemical Mechanical Polishing) method until the surface of a mask pattern ($Si_3N_4$ film) 102 is exposed and the polished surface is flattened. Thereafter, the mask pattern ($Si_3N_4$ film) 102 is removed with a heated $H_3PO_4$ solution.

As a result, a transistor formation region 105 is formed which is surrounded with the buried isolation film ($SiO_2$ film) 104. The buried isolation film 104 projects with a height of about 0.3 μm from the surface of the substrate, as shown in the figure.

As shown in FIG. 2D, to form a gate portion, an insulation film (5 nm thick) for forming a gate insulation film 106, a phosphorus-doped polycrystalline silicon film (10 nm thick) for forming a gate electrode 107, and a BPSG (Boron-Doped Phosphosilicate Glass) film (200 nm thick) for forming an upper gate-insulation film 108 are sequentially deposited and then patterned. As a result, the gate insulation film 106, the gate electrode 107 and the upper gate-insulation film 108 are formed.

The width of the gate electrode 107 is, for example, 0.15 nm. The upper surface of the upper gate-insulation film 108 is formed in almost the same plane as the upper surface of the buried insulation film 104. Subsequently, an $Si_3N_4$ film (30 nm thick) for a side wall gate-insulation film 109 is deposited over the entire surface. The entire surface of the $Si_3N_4$ film is then etched by means of anisotropic etching such as an RIE (Reactive Ion Etching) method. Consequently, the side wall gate-insulation film ($Si_3N_4$ film) 109 is formed. At this point, the $Si_3N_4$ film 109 is also left on the side wall of the buried isolation film 104, as shown in the figure.

Figure 2E:
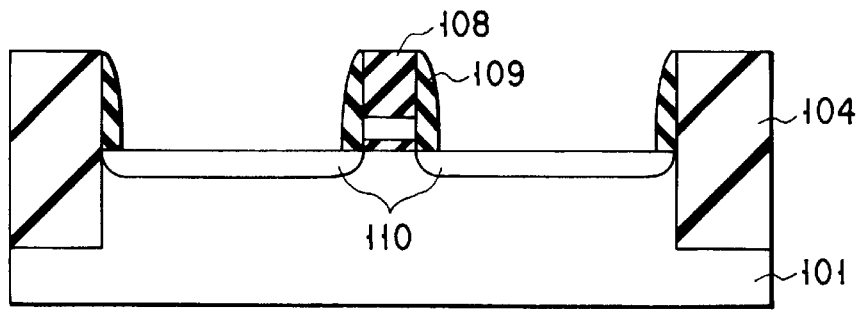

As shown in FIG. 2E, impurity ions are injected into the surface of the substrate by using the gate portion (consisting of members 106, 107, 108 and 109) as a mask. The injected impurity ions are activated by heat treatment, thereby forming a source/drain diffusion layer 110.

If impurity ions are injected into the substrate surface by use of the gate portion (consisting of the members 106, 107, and 108) as a mask prior to forming the source/drain diffusion layer 110, or prior to forming the side-wall gate-insulation film 109, the source/drain diffusion layer 110 having an LDD (lightly Doped Drain) structure can be formed. After the substrate surface is cleaned with Ar ions having energy as low as 100 ev or less, the surface of the substrate obtained is cleaned with no native oxide formed thereon.

Figure 2F:
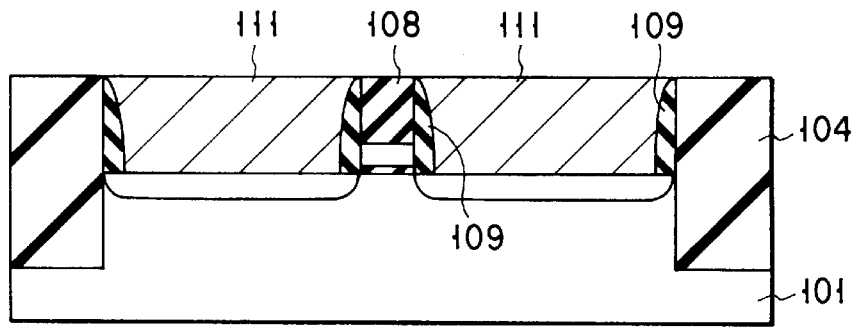

As shown in FIG. 2F, a nickel silicide ($NiSi_2$) film 111 (about 0.4 μm thick) is deposited over the clean surface by a directional sputtering method. Subsequently, the $NiSi_2$ film 111 is polished by the CMP method until the buried isolation film 104 and the upper gate-insulation film 108 are exposed, and then, the surfaces of the polished films are flattened. In this way, the $NiSi_2$ film 111 is allowed to remain selectively in the source/drain region between the gate portion and the buried isolation film 104.

Since the $Si_3N_4$ film 109 on the side walls of the gate portion and the buried isolation film 104 is provided in a tapered form, there are no side-wall portions perpendicular to the substrate in the element formation region.

Accordingly, the NiSi$_2$ film 111 can be uniformly deposited on the element formation region even if a directional sputtering method is employed. However, the NiSi$_2$ film 111 of this stage is in a polycrystalline state with an irregular crystalline orientation.

After only the upper portion of the NiSi$_2$ film 111 is selectively etched to the depth of about 50 nm by the CDE (Chemical Dry Etching) method, annealing is performed in a nitrogen atmosphere at 550° C. for 30 minutes. In this step, the polycrystalline NiSi$_2$ film 111 deposited by the sputtering method is epitaxially grown in the same <100> orientation as that of the silicon substrate 101. As a result, single crystal NiSi$_2$ film 111 is formed on the source/drain diffusion layer 110.

Figure 2G:
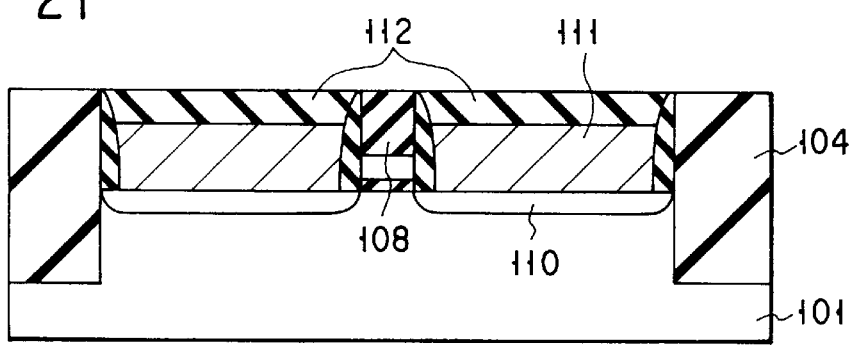

As shown in FIG. 2G, after the Si$_3$N$_4$ film 112 is formed over the entire surface, the Si$_3$N$_4$ film is polished and flattened by the CMP method. As a result, the Si$_3$N$_4$ film 112 is selectively buried only in a thickness-reduced region of the NiSi$_2$ film by the CDE method performed above. Through the aforementioned steps, the single crystal NiSi$_2$ film 111 (for lowering the resistance of the source/drain region) is formed on the source/drain diffusion layer 110, in a self-alignment manner.

The NiSi$_2$ film 111 is formed without reacting Si of the source/drain diffusion layer with Ni in this embodiment, unlike a conventionally-employed SALICIDE technique. Since Si of the source/drain diffusion layer is not consumed, a junction leakage will not take place even if the depth of the source/drain is shallow.

Figure 2H:
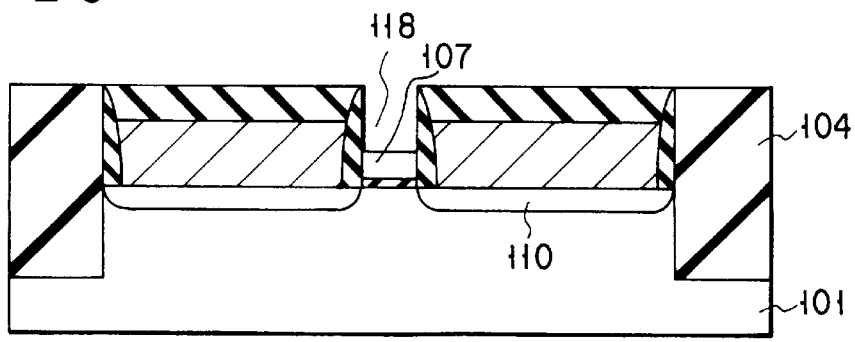

As shown in FIG. 2H, the upper gate-insulation film (BPSG film) 108 is selectively removed by etching using hydrofluoric acid vapor treatment. As a result, a wiring groove 118 is formed on the gate electrode 107.

Figure 2I:
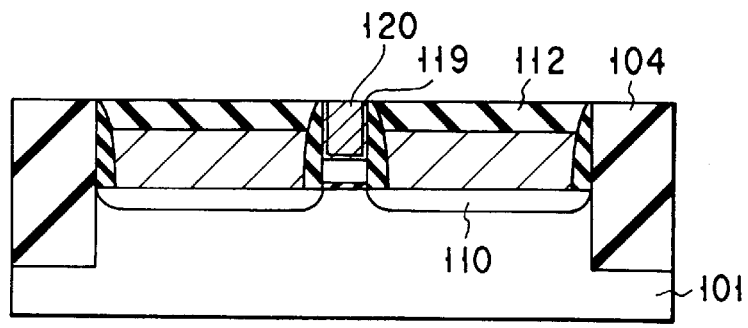

As shown in FIG. 2I, to form a TiN barrier metal film 119, a tungsten wiring 120, titanium nitride (TiN) film and a tungsten (W) film are sequentially formed over the entire substrate surface by the CVD method. The TiN film and the tungsten film are polished by the CMP method until the surfaces of the Si$_3$N$_4$ film 112 and the buried isolation film 104 are exposed, and then the surface of the polished films is flattened. In this manner, the TiN barrier metal film 119 and the tungsten wiring 120 are formed in the wiring groove 118. At this time, the upper surface of the tungsten wiring 120 is formed in almost the same plane as the upper surface of the buried isolation film 104.

Figure 2J:
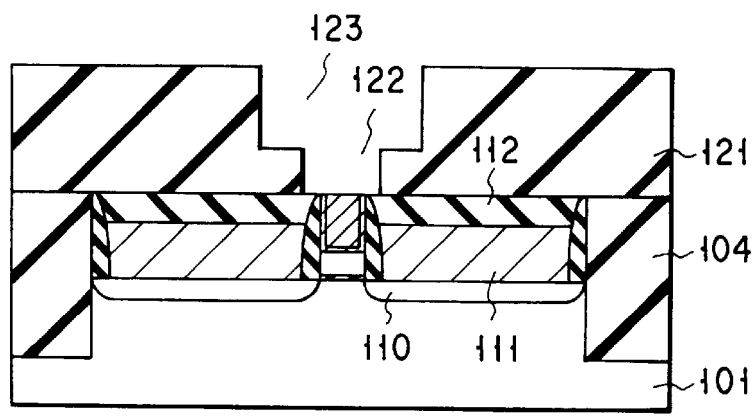

As shown in FIG. 2J, after an interlayer insulation film 121 made of e.g. SiO$_2$ film, is formed over the entire surface, a contact hole 122 and an upper layer wiring groove 123 corresponding to the gate portion, are formed within the interlayer insolation film 121. In this case, the contact hole 122 is formed in the region surrounded with the buried isolation film 104. Either contact hole 122 or the upper wiring groove 123 may be formed first. In this embodiment, since the NiSi$_2$ film 111 is covered with Si$_3$N$_4$ film 112, the contact hole 122 is prevented from reaching the NiSi$_2$ film 111.

Figure 2K:
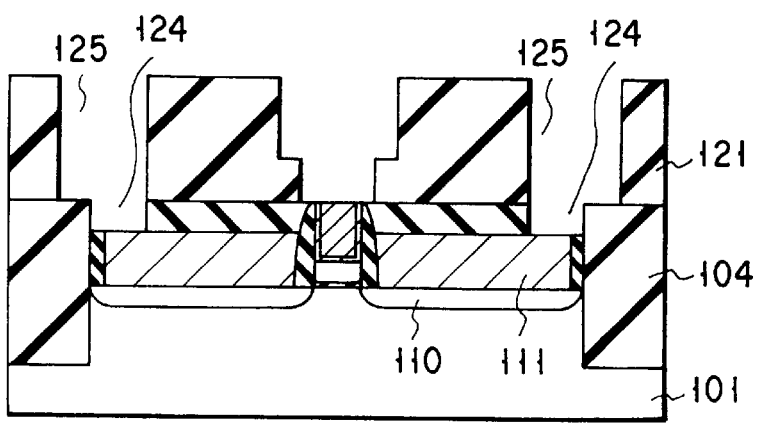

As shown in FIG. 2K, a contact hole 124 and an upper wiring groove 125 corresponding to the source/drain diffusion layer 110, are formed in the interlayer insulation film 121.

Figure 2L:
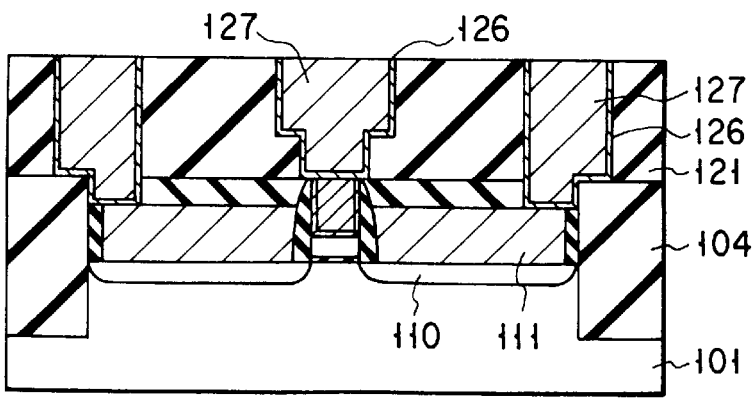

Finally, as shown in FIG. 2L, to form a TiN barrier metal film 126 and a tungsten film 127, a titanium nitride (TiN) film and a tungsten (W) film are formed over the entire substrate by the CVD method. Thereafter, the titanium nitride film and the tungsten film are polished by the CMP method until the surface of the interlayer insulation film 121 is exposed, and then the surfaces of those films are flattened.

In this manner, a TiN barrier metal film 126 and the tungsten wiring 127 are formed in contact holes 122, 124 and the upper wiring grooves 123, 125, respectively. As a result, the MOS transistor is accomplished.

According to this embodiment, the NiSi$_2$ film 111 (0.2 $\mu$m thick) can be easily formed in a self-alignment manner. It was also confirmed that the sheet resistance of the source/drain diffusion layer 110 is reduced to 1.5 ohm/square or less. The Si consumption at the interface between the NiSi$_2$ film 111 and the shallow source/drain diffusion layer 110 can be completely suppressed. Therefore, junction leakage, which is a serious problem with the conventional technique, is not observed.

It is easy for the NiSi$_2$ film 111 to grow epitaxially by subjecting the substrate to low temperature heating. The source/drain diffusion layer 110 can be formed in a single crystalline state with the same orientation as that of the substrate. As a result, the interface between the NiSi$_2$ film 111 and the source/drain diffusion layer 110 becomes flat at an atomic level. Hence, even if the device has at least 1 million source/drain diffusion layers, the contact interface can be obtained with a uniform contact resistance. The reliability of the contact interface is thereby ensured.

When silicon is thermally reacted with nickel to form NiSi$_2$, the heat treatment must be performed usually at a temperature of 700° C. or more. However, problematic projections and depressions are generated in the surface along the <111> silicon plane by the high temperature treatment. Whereas, in this embodiment, the projections and depressions will not be raised and NiSi$_2$ having ideal interface characteristics can be easily formed in a self-alignment manner.

According to this embodiment, the contact hole 122 reaching the gate electrode 107 can be formed in the transistor region surrounded with the buried isolation film 104. According to this embodiment, the device can be formed with higher integration density, compared to the device employing a conventional element structure requiring the formation of a contact to the electrode led on the buried isolation film 104.

In this embodiment, to form the NiSi$_2$ region (silicide region), a gate electrode wiring region, and an upper electrode wiring region, a buried wiring is used which is processed by the CMP method. Hence, the elements can be easily formed flat, ensuring high reliance of the device.

This embodiment can be modified in various manners. If a CoSi$_2$ film is used, for example, in place of the NiSi$_2$ film as a silicide film, the same effects can be obtained. This is because even if the CoSi$_2$ film is used, the single crystalline structure can be epitaxially grown with the same orientation as that of the substrate in the source/drain diffusion layer by employing the same procedure.

Furthermore, if a silicide film consisting of silicon and a transition metal other than those mentioned, such as TiSi$_2$, WSi$_2$, MoSi$_2$, or VSi$_2$, the same structure as above can be attained.

A silicide film not epitaxially grown on the substrate may be used. In this case, the silicide film is obtained with a polycrystalline structure. However, the erosion of Si at the interface between the silicide film and the substrate, can be completely suppressed, with the result that an increase of the junction leakage associated with the formation of the silicide film can be completely suppressed.

Silicide films other than the aforementioned ones may be used. Furthermore, a metal film may be used. In either case, the thickness of the silicide film or the metal film formed on the source/drain diffusion layer can be arbitrarily set, so that the value of resistance can be easily controlled for attaining desired element characteristics.

The effects of the present invention can be obtained most effectively when the silicide film is used. Instead of using the silicide film formed by the sputtering method, a laminate film of a Ti film (5 nm thick), TiN film (10 nm thick), and W film (0.3 µm thick) may be formed by the sputtering method, and then a tungsten wiring may be formed in a self-alignment manner on the source/drain diffusion layer through the same steps as those of this embodiment.

In this case, silicon (12 nm) is eroded from the surface of the silicon substrate as a result of the reaction with a Ti film (5 nm). However, the Si erosion amount is low compared to the amount eroded from the substrate formed by the conventional technique and requiring a thick TiSi$_2$ film. The present invention can be applied onto the shallow junction (80 nm depth) to which a conventional technique cannot be applied.

(Embodiment 2)

FIGS. 3A–3H are cross sectional views of a p-channel MOS transistor, sequentially showing the steps of manufacturing the p-channel MOS transistor according to Embodiment 2 of the present invention.

Figure 3A:
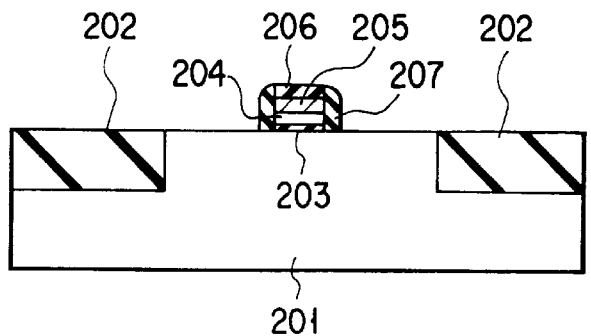

As shown in FIG. 3A, an n-type silicon substrate 201 having the <100> plane orientation is first prepared with a specific resistivity of 4–6 Ω cm. In the surface of the n-type silicon substrate 201, a groove (0.3 µm depth) is formed. In the groove, an element isolation film 202 is buried by use of a material such as TEOS. Subsequently, a gate oxide film 203 (7 nm thick) is formed by thermal oxidation. On the gate oxide film 203, an impurity-doped polycrystalline silicon film 204 (50 nm), a tungsten silicide film 205 (50 nm thick), and a silicon nitride film 206 (50 nm thick) are sequentially laminated by an LPCVD (Low Pressure Chemical Vapor Deposition) method. Consequently, a gate electrode is formed.

When these laminated film are is etched by the RIE method using a resist mask, a gate side-wall insulation film 207 made of a silicon nitride film (about 50 nm thick) is formed on the side walls of the laminated films thus etched. The gate side-wall insulation film 207 is obtained by depositing a silicon nitride film (50 nm thick) over the entire surface by, for example, the CVD method, followed by etching the entire surface by anisotropic dry etching.

Figure 3B:
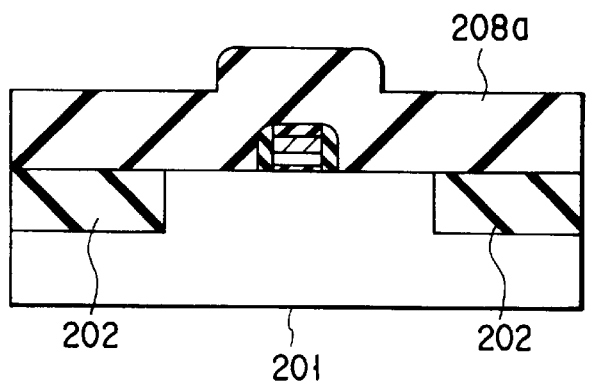
Figure 3C:
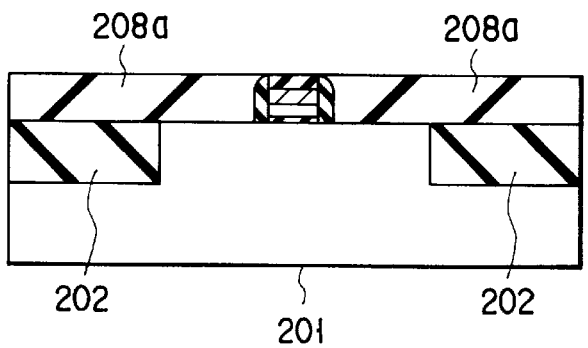

As shown in FIG. 3B, a silicon oxide film 208a (about 200 nm) is deposited over the entire surface by the CVD method using TEOS. Subsequently, as shown in FIG. 3C, the entire surface is polished to the height of the gate portion and then flattened. Since the polishing rate of the silicon nitride film 206 (the top layer of the gate portion) is lower than that of the silicon oxide film 208a, the silicon nitride film 206 acts as a stopper. Hence, excessive polishing of the silicon oxide film 208a can be prevented. The silicon nitride film 206 is used as a stopper in this embodiment, however, any film may be used as long as it is capable of stopping the polishing of the silicon oxide film 208a when it reaches the same height as that of the gate electrode 204 and as long as it has no effects on the transistor characteristics.

Figure 3D:
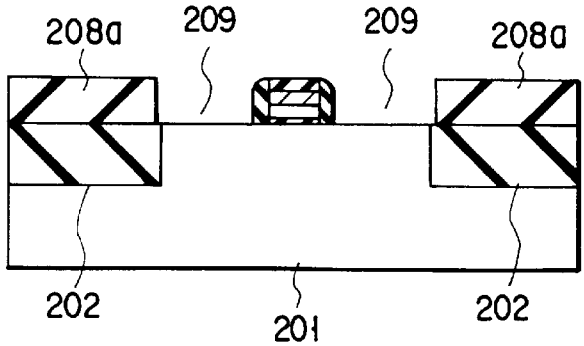

As shown in FIG.3D, the silicon oxide film 208a on the source/drain region is removed by the RIE method using a resist mask (not shown). Consequently, an opening portion 209 is formed.

Thereafter, a native oxide film, on the exposed silicon surface of the source/drain region is removed with a dilute hydrofluoric acid solution and then, the substrate 201 is introduced in a low pressure reaction chamber.

Subsequently, for example, a disilane gas and a diluted diborane gas (10%) are introduced into the lower pressure reaction chamber at a flow rate of 20 sccm at 300° C. As a result, as shown in FIG. 3E, an amorphous silicon thin film 210 containing boron is deposited over the entire substrate surface.

To crystallize the amorphous silicon thin film 210, heat treatment is provided to the amorphous silicon thin film 210 in a nitrogen atmosphere for 2 hours at 600° C. As a result, the amorphous silicon thin film 210 on the source/drain region is single-crystallized and the amorphous silicon thin film 210 on the silicon oxide film 208a is polycrystallized.

Furthermore, boron is diffused into the substrate from the silicon thin film 210 by high-temperature and short-time heat treatment performed in a nitrogen atmosphere, with the result that a source/drain diffusion layer 211 is formed.

Since the boron-concentration profile is controlled well in this method, boron can be doped shallow with a high concentration into the surface of the substrate. As a result, a shallow and low resistant source/drain diffusion layer 211 can be formed. In addition, since the amorphous silicon thin film 210 is single-crystallized by a solid-phase growth, the heating can be performed at a low temperature and a high carrier concentration is attained. These features are advantageous in forming a shallow and low resistance source/drain layer 211. Note that the crystallization of the amorphous silicon thin film 210 and the boron diffusion into the substrate may be performed simultaneously in a single heat treatment step.

Then, the entire surface of the substrate is polished with a polishing agent made of alkali colloidal silica (pH 10–11). Since the polishing rate of the polycrystalline silicon is 0.5 µm/min and the polishing rate of the silicon oxide film is $\frac{1}{100}$ or less of the polycrystalline silicon, the boron-containing silicon thin film 210 can be allowed to remain only in the opening on the source/drain region, as shown in FIG. 3F. More specifically, the silicon thin film 210 formed over the entire surface can be left selectively in the opening by polishing in a self-alignment manner. In this manner, the silicon thin film 210 can be separated on the gate portion even if the gate length is formed in the lowermost dimensions.

In the step of or the step related to forming the source/drain diffusion layer, the margin for lithographic misalignment can be lowered. Accordingly, the source/drain diffusion layer can be formed in almost the same dimensions as those of the gate electrode. As a result, the miniaturization of the device can be attained.

As shown in FIG. 3G, a titanium thin film of 25 nm thick (not shown), and a titanium nitride thin film of 50 nm thick (not shown) are sequentially deposited by sputtering. Thereafter, the entire titanium thin film is reacted with the silicon thin film 210 (source/drain diffusion layer) in 1-minute heat treatment in a nitrogen atmosphere at 700° C. to form a titanium silicide film 212 only on the source/drain region.

The unreacted titanium thin film remaining on the insulation film including the titanium nitride film and the silicon oxide film 208a is selectively removed with a mixed solution of an aqueous hydrofluoric acid solution, sulfuric acid and hydrogen peroxide.

The silicon thin film 210 deposited on the source/drain diffusion region 211 is uniformly deposited on the inner surface of the opening. In a selectively grown epitaxial film in a conventionally employed method, a facet is produced at the end portion of the surface of the source/drain layer. Therefore, the substantial thickness of the facet is reduced with the result that the reliability of the source/drain diffusion layer 211 is decreased by the Si consumption at the time of the formation of the titanium silicide film 212. However, in this embodiment, it is possible to avoid decrease in the reliability caused by the aforementioned reason.

As shown in FIG. 3H, after a silicon oxide film 208b (about 200 nm) is deposited over the entire surface by the CVD method using TEOS, the silicon oxide film 208b is patterned by using a resist mask (not shown), thereby forming a contact hole on the source/drain region. Subsequently, an aluminium film (800 nm) containing silicon and copper contained in an amount of 0.5% for each is formed and then patterned to form a source/drain electrode 213. Thereafter, heat treatment is performed in a nitrogen atmosphere containing hydrogen (10%) for 15 minutes at 450° C. (Embodiment 3)

FIGS. 4A–4H are cross sectional views of a p-channel MOS transistor, Sequentially showing the steps of manufacturing the p-channel transistor according to Embodiment 3 of the present invention.

Figure 4A:
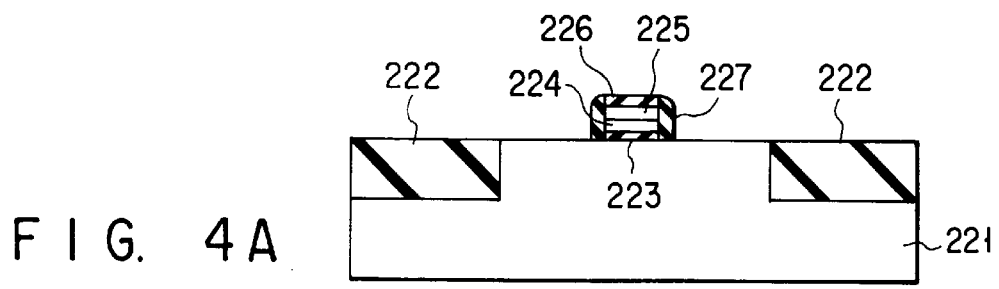
FIGS. 4A–4H are cross sectional views of an MOS transistor, sequentially showing the steps of manufacturing the MOS transistor according to Embodiment 3 of the present invention.

As shown in FIG. 4A, an n-type silicon substrate 221 having the <100> plane orientation is prepared with a specific resistivity of 4–6 Ωcm. On the surface of the n-type silicon substrate 221, a groove (about 0.3 μm depth) is formed. Then, an element isolation film 222 is buried in the groove by use of a material such as TEOS. Thereafter, the same procedure as in Embodiment 2 is repeated to form a gate portion consisting of a gate oxide film 223, impurity-doped polycrystalline silicon film 224, tungsten silicide film 225, silicon nitride film 226, and side-wall silicon nitride film 227.

Figure 4B:
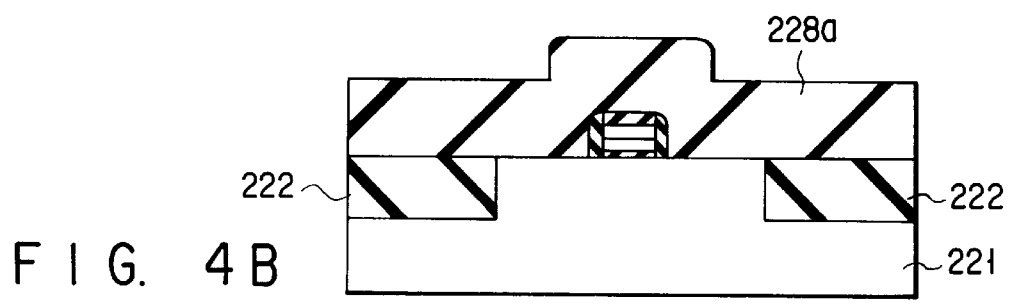
Figure 4C:
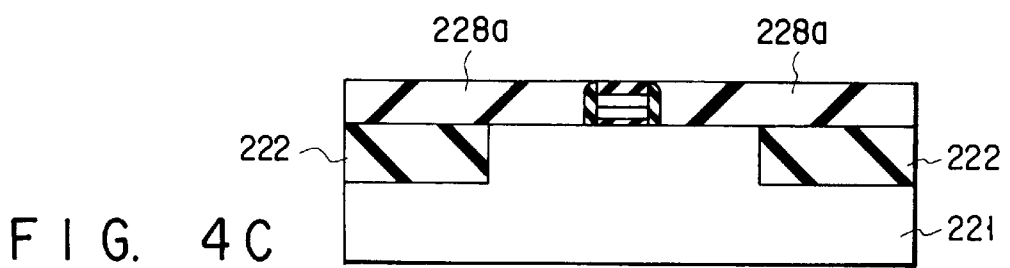

As shown in FIG. 4B, after silicon oxide film 228a (about 200 nm) is deposited over the entire substrate surface by the CVD method using TEOS, the surface of the substrate is polished to the same height as that of the gate portion and flattened, as shown in FIG. 4C.

Figure 4D:
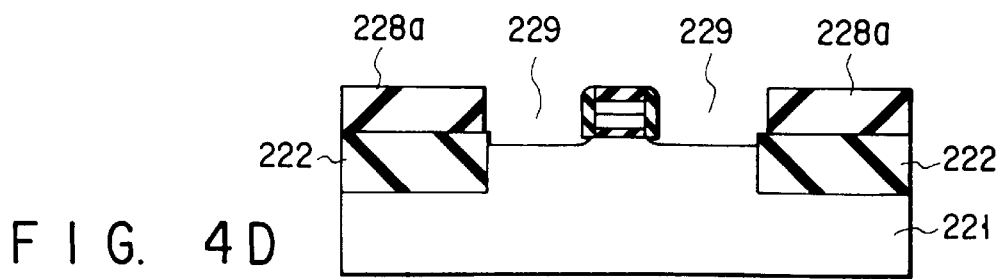

As shown in FIG. 4D, using a resist patterned mask (not shown), the silicon oxide film 228a on the source/drain region is removed by the RIE, to form an opening 229.

After the native oxide film on the exposed silicon substrate of the source/drain region is removed with a dilute hydrofluoric acid solution, the substrate 221 is introduced into a low pressure reaction chamber 221. On the surface of the substrate 221 in the low pressure reaction chamber 221, active species generated by a micro-wave discharge of a carbon tetrafluoride gas ($CF_4$ gas) is supplied. As a result, the exposed silicon surface of the source/drain region is selectively etched to a desired depth in an isotropic manner. In this way, a shallow groove is formed in the substrate surface. Owing to the selective isotropic etching, the source/drain region is formed in such a manner that it enters under the side wall gate-insulation film. Therefore, a silicon thin film containing an impurity (which will be formed in a later step) can be introduced into the portion under the side wall gate-insulation film. As a result, a junction interface having a steep impurity distribution profile can be positioned in the proximity of the channel. As a result, the parasitic resistance between the source and the drain can be reduced.

Now, we will change the subject to a film-formation step of the silicon thin film in a vacuum or a non-oxidative atmosphere.

Figure 4E:
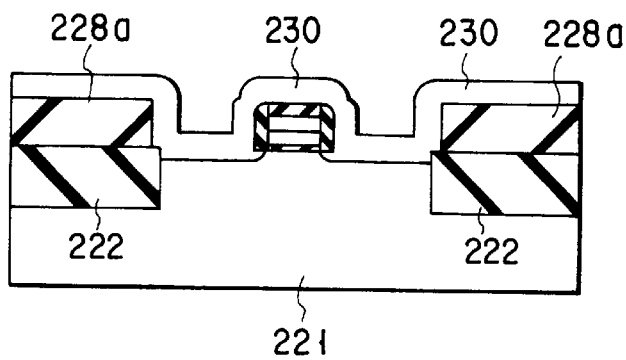

As shown in FIG. 4E, a disilane gas and a diluted (10%) diborane gas are first supplied to a film-formation chamber at a flow rate of 100 sccm and 20 sccm, respectively at 300° C. In this manner, an amorphous silicon thin film 230 containing boron is formed over the entire surface of the substrate.

To crystallize the amorphous silicon thin film 230, heat treatment is applied to the amorphous silicon thin film 230 in a nitrogen atmosphere for 2 hours at 600° C. As a result, the amorphous silicon thin film 230 on the source/drain region is single-crystallized, whereas, the amorphous silicon thin film 230 on the silicon oxide film 228a is polycrystallized. In this case, since the amorphous silicon thin film 230 is deposited, the single crystallization can be performed at a temperature as low as 600° C. Furthermore, the concentration of the carrier can be increased more than the solid solubility of silicon, so that the resistance of the single crystalline silicon thin film 230 serving as the source/drain layer, can be reduced.

When the amorphous silicon thin film 230 is formed under the aforementioned conditions, for example, with the heat treatment performed in the boron concentration of about $1 \times 10^{21}$ atoms/$cm^3$, for 2 hours at 600° C., a carrier concentration of about $4 \times 10^{20}$ atoms/$cm^3$ is obtained. Since the solid solubility of boron at 600° C. is about $6 \times 10^{18}$ atoms/$cm^3$, the boron concentration and the carrier concentration can be increased higher than those conventionally obtained ones.

Figure 4F:
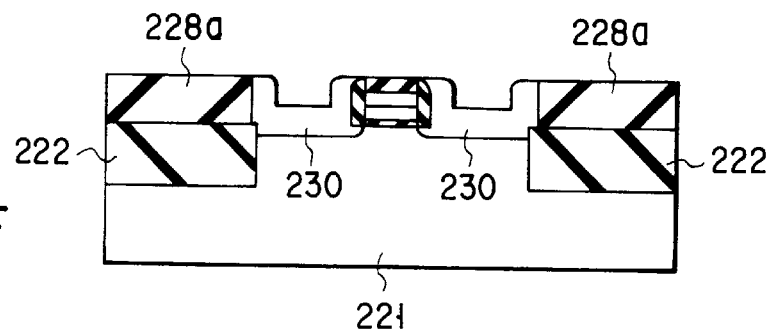

As shown in FIG. 4F, the entire surface of the substrate is polished by a polishing agent made of alkali colloidal silica maintained at pH 10–11. As a result, the boron-containing silicon thin film 230 serving as a source/drain layer is allowed to remain only in the opening on the source/drain region.

Figure 4G:
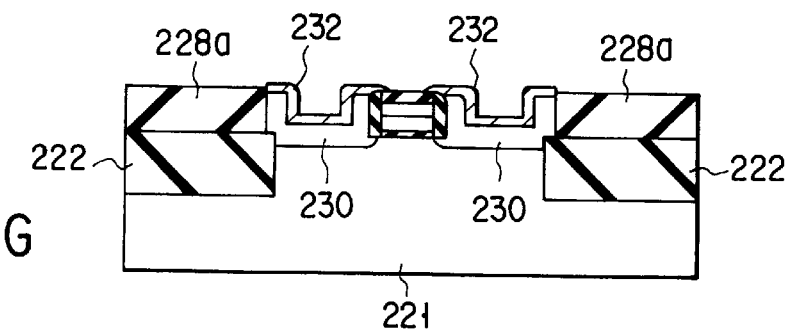

As shown in FIG. 4G, after a titanium thin film of 25 nm thick (not shown) and a titanium nitride thin film of 50 nm thick (not shown) are sequentially deposited over the entire surface, a heat treatment is performed in a nitrogen atmosphere for one minute at 700° C. As a result, the entire titanium thin film can react with the silicon thin film (source/drain layer) 230 to form a titanium silicide film 232 only on the source/drain layer 230.

Thereafter, an unreacted titanium thin film on the insulation film such as a titanium nitride film and the silicon oxide film 228a is selectively removed with a mixed solution of an aqueous hydrofluoric acid, sulfuric acid and hydrogen peroxide. As the silicon thin film 230 thus formed becomes thinner, the titanium silicide film 232 comes closer to the channel. Hence, the parasitic resistance between the source and the drain can be reduced.

In this Embodiment and Embodiment 2, titanium is used as a metal for forming a silicide. The same effect can be obtained even if another metal such as nickel, cobalt, platinum, vanadium, or palladium is used. Since the amount of the silicon thin film consumed in the silicide reaction varies depending on the type of metal used and film thickness, the silicon thin film must be formed thicker than the thickness to be consumed.

Figure 4H:
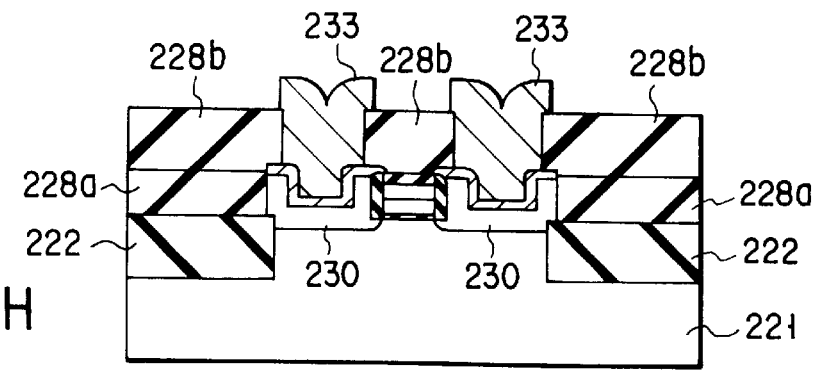

As shown in FIG. 4H, a silicon oxide film 228b (about 200 nm) is deposited over the entire surface of the substrate by the CVD method using TEOS, and patterned by use of a resist mask (not shown). Consequently, a contact hole is formed in the source/drain diffusion layer 230.

Subsequently, an aluminum film (800 nm) having silicon and copper in an amount of 0.5 % for each is formed and patterned to form a source/drain electrode 233. Thereafter, a heat treatment is performed in a nitrogen atmosphere containing hydrogen (10%) for 15 minutes at 450° C.

In this embodiment, the same effects as in Embodiment 2 can be obtained. (Embodiment 4)

FIGS. 5A–5G are cross sectional views of a p-channel MOS transistor, sequentially showing the steps of manufacturing the p-channel MOS transistor according to Embodiment 4 of the present invention.

As shown in FIG. 5A, an n-type silicon substrate 241 having the <100> plane orientation is prepared with a specific resistivity of 4–6 Ωcm. On the surface of the n-type silicon substrate 241, a groove (about 0.3 μm) is formed. Then, an element isolation film 242 is buried in the groove by use of a material such as TEOS. Thereafter, the same procedure as in Embodiment 2 is repeated to form a gate portion consisting of a gate oxide film 243, impurity-doped polycrystalline silicon film 224, tungsten silicide film 245, silicon nitride film 246, and side-wall silicon nitride film 247.

As shown in FIG. 5B, after silicon oxide film 248a (about 200 nm) is deposited over the entire substrate by the CVD method using TEOS, the surface of the substrate is polished to the same height as that of the gate portion and then flattened, as shown in FIG. 5C.

As shown in FIG. 5D, using a resist patterned mask (not shown), the silicon oxide film 248a on the source/drain region is removed by the RIE method, to form an opening 249.

After the native oxide film on the exposed silicon substrate of the source/drain region is removed with a dilute hydrofluoric acid solution or the like, the substrate 241 is introduced into a low pressure reaction chamber. On the surface of the substrate 241 in the low pressure reaction chamber, active species generated by a micro-wave discharge of a carbon tetrafluoride gas ($CF_4$ gas) is supplied. As a result, the exposed silicon surface of the source/drain region is selectively etched to a desired depth in the same manner as Embodiment 3.

Now, we will change the subject to a film-formation step of the silicon thin film in a vacuum or a non-oxidative atmosphere.

As shown in FIG. 5E, a disilane gas and a diluted (10%) diborane gas are first supplied to a film-formation chamber at a flow rate of 100 sccm and 20 sccm, respectively, at 300° C. In this manner, an amorphous silicon thin film 250 containing boron is formed over the entire surface of the substrate. Under these film-formation conditions, the concentration of boron contained in the amorphous silicon thin film 250 is $4 \times 10^{20}$ atoms/cm$^3$. The resistance of the amorphous silicon thin film 250 decreases. At that time, if the film thickness of the amorphous silicon thin film 250 is set to ½ of the opening width of the opening 249 on the source/drain region, the opening 249 can be filled completely.

As shown in FIG. 5F, when the amorphous silicon thin film 250 is polished by the CMP method to the height of the gate portion, the amorphous silicon thin film 250 is separated on the gate portion. As a result, the amorphous silicon thin film 250 is allowed to remain selectively in the opening 249.

As the polishing agent, for example, an alkali colloidal silica maintained at pH 10–11 is used.

Consequently, the thick and highly-doped source/drain layer 250 made of an amorphous silicon thin film, that is, the low resistance source/drain layer 250 is formed. Therefore, according to this embodiment, the silicide formation step can be omitted.

To crystallize the source/drain layer 250, a heat treatment is performed in a nitrogen atmosphere for 2 hours at 600° C. Different from Embodiments 2 and 3, no silicide film is formed on the upper surface of the source/drain layer 250 for reducing the resistance of the source/drain diffusion layer. However, the boron concentration of the source/drain layer 250 is high, and the transistor can be operated at a satisfactory rate.

As shown in FIG. 5G, after a silicon oxide film 248b (about 300 nm) is deposited over the entire surface of the substrate by the CVD method using TEOS, a contact hole is formed on the source/drain layer 250 by use of a patterned resist mask (not shown). Subsequently, an aluminium film (800 nm) containing silicon and copper in an amount of 0.5% for each is formed and patterned, to form a source/drain electrode 253. Thereafter, heat treatment is performed in a nitrogen atmosphere containing hydrogen (10%) for 15 minutes at 450° C.

FIG. 6 is a diagram showing the relationship between the junction depth and the sheet resistance in the source/drain layer (boron-doped silicon thin film) formed in accordance with the present invention and in the diffusion layer formed by a conventional ion-implantation method.

As is apparent from FIG. 6, according to this embodiment, a source/drain diffusion layer can be formed with a lower sheet resistance than the conventional one. This is because the boron containing silicon thin film used in the source/drain diffusion layer of the present invention is a solid-phase growing film from the amorphous silicon thin film. Hence, a dopant is contained in a high concentration and the dopant profile shows a steep curve.

According to this embodiment, since the depth of the source/drain layer can be controlled by etching the boron-doped silicon thin layer, a shallow source/drain layer of 100 nm or less can be easily formed. Besides this, the same effects as those of Embodiment 2 can be obtained. In Embodiments 2 to 4, an MOS transistor is formed on a flat substrate since an element isolation film and an element region are formed with the same height. The MOS transistor can be formed on a substrate having a stepped portion resulting from the element isolation film being higher than that of the element region.

FIGS. 7A–7H show the steps of manufacturing an MOS transistor on a substrate having a stepped portion in Embodiment 3. The like reference numerals designate like structural elements corresponding to those shown in FIGS. 4A–4H.

Figure 7A:
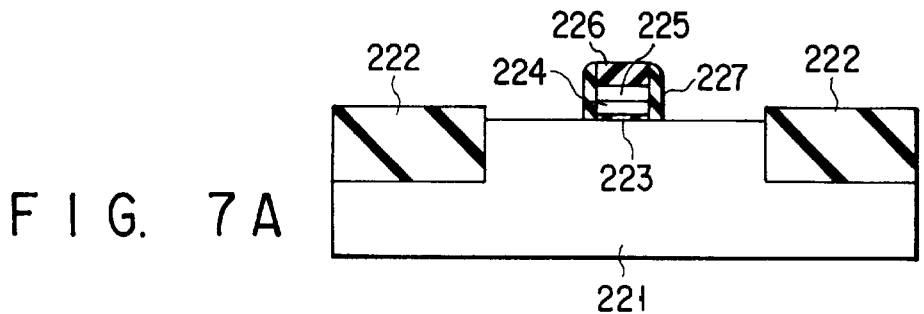
FIGS. 7A–7H are cross sectional views of an MOS transistor, sequentially showing the manufacturing steps of a MOS transistor according to a modified example of Embodiment 3 of the present invention.
Figure 7B:
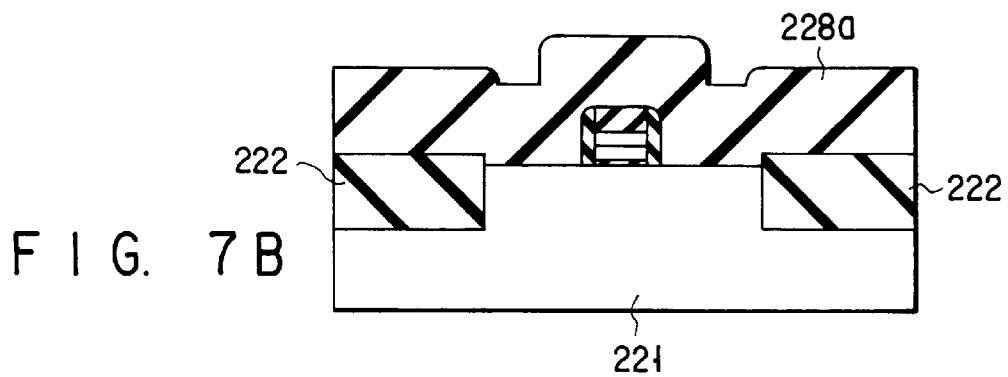
Figure 7C:
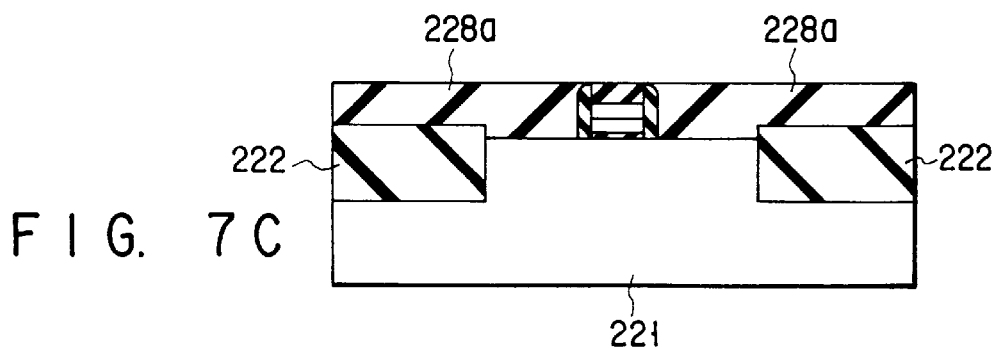
Figure 7D:
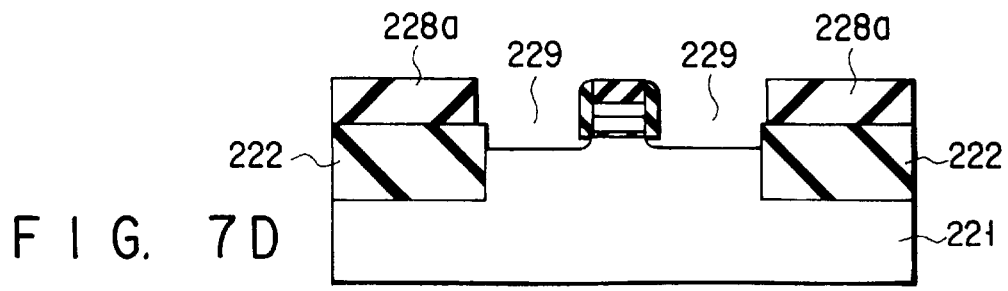
Figure 7E:
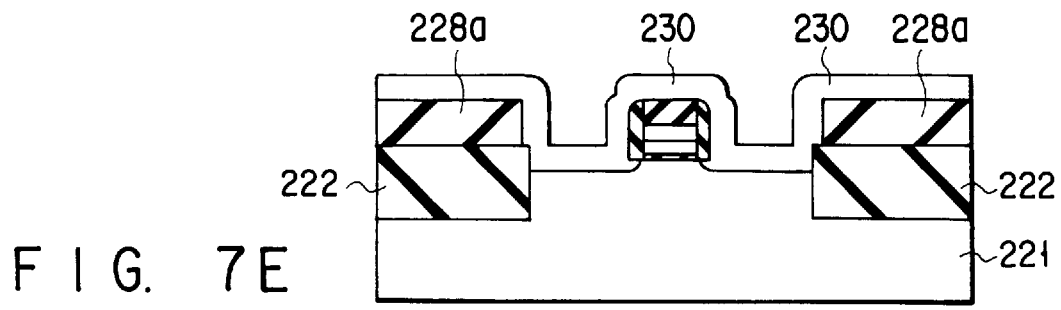
Figure 7F:
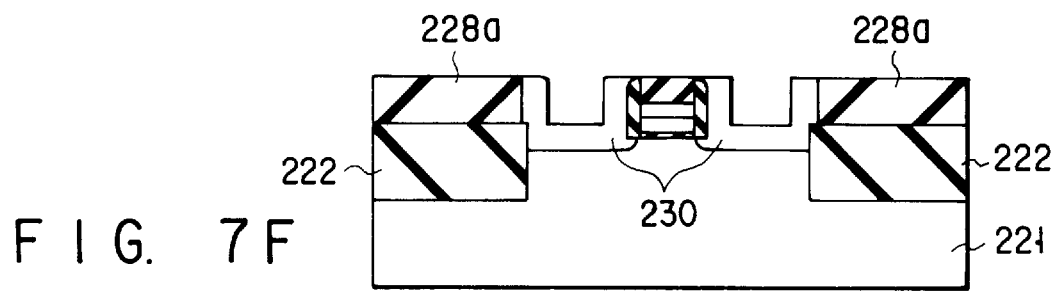
Figure 7G:
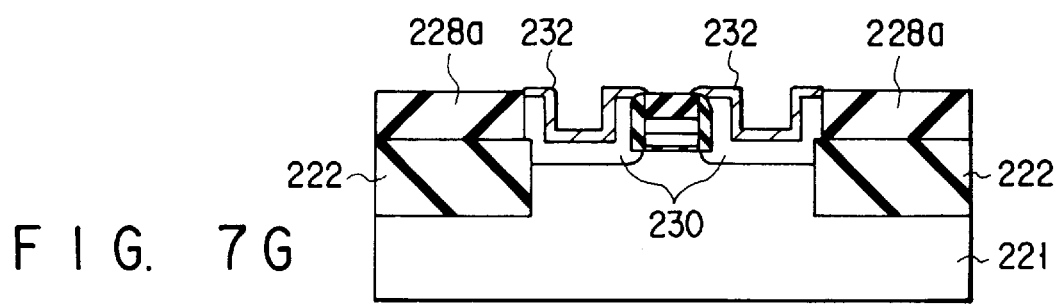
Figure 7H:
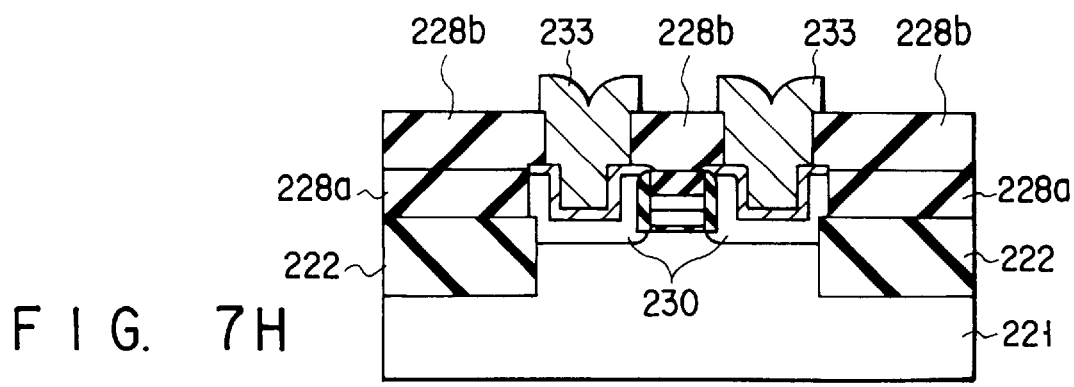

In FIG. 7A, a silicon nitride film 226 of the gate portion may be formed in a thickness equal to or thicker than the difference in height between an element isolation film and an element region in Embodiment 3. Thereafter, the same steps as those of Embodiment 3 may be repeated. When the substrate having a stepped portion on the surface is used in the cases of Embodiments 2 and 4, the same procedure as that in this embodiment may be employed.

In Embodiments 2 to 4 as well as in other Embodiments, a general silicon substrate is used as a semiconductor substrate. An SOI (silicon on insulator) substrate formed by the SIMOX (separation by implanted oxygen) method may be used.

In Embodiments 2 to 4, the exposed silicon surface of the source/drain region is etched by use of activated $CF_4$ with a microwave discharge. Instead of $CF_4$, other halogen series material, such as $F_2$, $Cl_2$, $SF_6$, HF, $ClF_3$ or the like may be used.

In Embodiments 2 to 4, a mixed gas of a disilane gas and a diborane gas is used as a material gas of the thin silicon film. The gas is not limited in types. Examples of an applicable gases include silane ($SiH_4$), dichlorsilane ($SiH_2Cl_2$), $SiCl_4$, $SiF_4$, $SiR_2H_4Cl_2$, $SiH_2F_2$, $Si_2H_2Cl_4$, $Si_2Cl_6$, $Si_2H_4F_2$ and $Si_2F_6$.

When an impurity-doped thin silicon film is formed, boron trichloride ($BCl_3$) or boron trifluoride ($BF_3$) other than a diborane may be added to the aforementioned gas in the case of a p-type MOS transistor. Phosphine ($PH_3$), arsine ($AsH_3$) or a halogenated compound containing phosphorus or arsenic may be added to the aforementioned gas in the case of an n-type MOS transistor.

(Embodiment 5)

FIGS. 8A and 8B are cross sectional views of an MOS transistor, showing the steps of manufacturing the MOS transistor according to Embodinent 5 of the present invention. In the transistor of this Embodiment, the upper surface of the gate portion is formed in the same plane as the upper portion of the source/drain diffusion layer.

As shown in FIG. 8A, a gate portion is formed on a silicon substrate 301 in the element formation region defined by the element isolation film 302. Thereafter, the surface of the substrate of the source/drain region is etched and then a doping film 307 is formed over the entire surface.

In FIG. 8A, reference numeral 303 indicates a gate electrode formed of polysilicon and reference numeral 304 denotes a gate insulation film, a side-wall gate insulation film, and an upper gate insulation film. The gate electrode 303 is formed by using a resist mask with the gate length set in the lowermost dimensions. The doping film 307 is a silicon film to which phosphorus, boron or arsenic is doped by a CVD method. The doping film 307 may be formed of silicide which is an alloy formed from silicon and a refractory metal such as tungsten or titanium.

When the source/drain layer is formed by etching the doping film 307 using a resist mask, the source/drain layer cannot be formed accurately in position since the gate electrode 303 is formed also on the gate electrode 303. This is because a masking error occurs since the resist mask formed in the lowermost dimensions is used.

Then, the doping film 307 is polished to remove the doping film 307 on the gate electrode, as shown in FIG. 8B. In this manner, the doping film 307 is allowed to remain selectively in two source/drain regions. As a result, the source/drain diffusion regions 305 and 306 are formed accurately in position. The method of separating the source/drain diffusion layer 305 or 306 from the adjacent region will be described later.

(Embodiment 6)

FIGS. 9A–9D are cross-sectional views of an MOS transistor, sequentially showing the steps of manufacturing the MOS transistor according to Embodiment 6 of the present invention. In the transistor of this Embodiment, the upper surface of the gate portion is formed in the same plane as that of the source/drain diffusion layer.

FIG. 9A is a cross sectional view of the MOS transistor after completion of the gate portion formation step. As the element isolation film 312, a buried oxidation film is used. The buried oxidation film is formed by etching the element isolation region of the silicon substrate 311 by means of anisotropic ion etching, depositing the oxide film by means of the CVD method using TEOS, and polishing and flattening the surface of the substrate.

After completion of the element isolation film 312, a gate oxidation film 314 is formed by thermal oxidation at 950° C. in an oxygen atmosphere. Subsequently, a polycrystalline silicon film, which will be a gate electrode 313, is deposited at 620° C. by the CVD method using a silane gas. After phosphorus is introduced into the polycrystalline silicon by phosphorus diffusion, the phosphorus-doped silicon is patterned by use of a resist mask, thereby forming a gate electrode 313. Usually, a silicon nitride film is deposited on the polycrystalline silicon film prior to patterning.

After formation of the gate electrode 313, a silicon oxide film is deposited over the entire surface in a thickness equal to or more than the thickness of the gate portion. The entire surface of the resultant structure is subjected to anisotropic ion etching, to form a silicon oxide film selectively on the side-wall of the gate portion. The silicon oxide film and the silicon nitride film of the side wall of the gate portion are indicated by the same reference number 314 as that of the gate oxide film.

FIG. 9B is a cross sectional view of the MOS transistor immediately after the silicon substrate 311 of the source/drain region is etched. The etching is performed by a so-called chemical dry etching method using activated $CF_4$ gas by means of RF discharge or by an etching method using a $CIF_3$ gas. Any etching method may be used as long as the silicon substrate 311 is selectively etched without the oxide film being etched. However, an isotropical etching method is; preferably used.

FIG. 9C is a cross sectional view, of the MOS transistor immediately after the doping film 317 is deposited over the entire surface of the substrate. The doping film 317 is formed by the CVD method using a disilane gas or a diborane gas at 350° C. When an n-channel MOS transistor is formed, the doping film 317 containing phosphorus or As is formed.

FIG. 9D is a cross sectional view of the MOS transistor at the time the source/drain layers 315 and 316 are formed by polishing the doping film 317 in the same manner as in Embodiment 5. The doping film 317 is polished with a polishing agent, alkali colloidal silica, at pH 10–11. The polishing rate of the polycrystalline silicon is 0.5 $\mu$m/minute. The polishing rate of the silicon oxide ($SiO_2$) is 1/100 or less of that of the polycrystalline silicon. The polishing rate of the silicon nitride is considerably lower than that of the polycrystalline silicon. Hence, when the insulation film 314 on the gate electrode is exposed, the polishing does not proceed any more.

(Embodiment 7)

FIGS. 10A–10E are cross sectional views of an MOS transistor, sequentially showing the steps of manufacturing the MOS transistor according to Embodiment 7 of the present invention. In this embodiment, two MOS transistors are connected by way of a shared source and drain. The upper surfaces of the gate portions are formed in the same plane as those of the source/drain diffusion layers.

The gate oxide film is formed by thermal oxidation. As the gate electrode 323, a polycrystalline silicon film is used which is formed by use of a silane gas at 620° C. The gate oxidation film is preferably formed in accordance with a conventional element formation process, for example, by performing pseudo oxidation prior to the formation of the gate oxidation film.

Figures 10A, 10B, 10C, 10D, 10E:
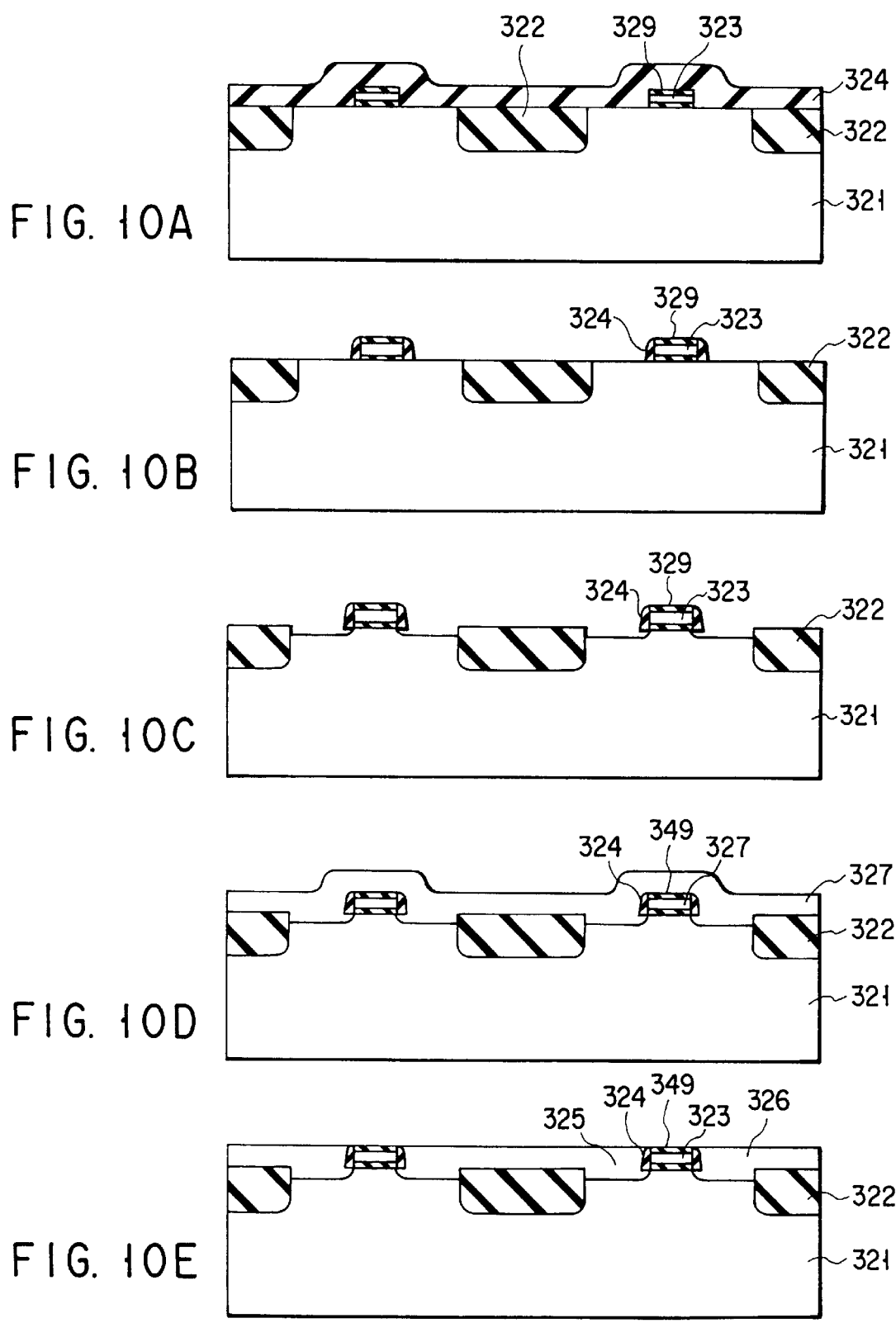
FIGS. 10A–10E are cross sectional views of an MOS transistor sequentially showing the steps of manufacturing the MOS transistor according to Embodiment 7 of the present invention.

As shown in FIG. 10A, on a silicon substrate 321 having an element isolation film 322 and a gate portion are formed therein and on, respectively, an insulation film 324 is deposited over the entire surface. The same effects of the present invention by using obtained by using either an oxide film or a nitride film as the insulation film 324. It is preferable that the gate processing be performed after a silicon nitride film 329 is deposited on the gate electrode 323, since the gate electrode 323 will be protected in a later processing step.

As shown in FIG. 10B, the entire surface is etched by use of the RIE method to form an insulation film 324 selectively on the side wall of the gate electrode 323. Thereafter, the source/drain region may be formed by introducing an impurity B, As or P into the source/drain region and activating the impurity by heat treatment at 850° C. However, this embodiment does not employ such a method but employs a doping film as is the same as in the previous embodiment to render the junction region shallow.

As shown in FIG. 10C, the source/drain region of the silicon substrate 321 is etched. As shown in FIG. 10D, a doping film 327 is formed over the entire surface by the CVD method using a diborane and disilane gas at 350° C. In place of the CVD method, a film-formation method such as a sputtering method or a UHV (ultra high vacuum) deposition method may be used. In this case, if the doping film 327 is amorphous, the doping film 327 may be crystallized by treating with heat for 2 hours at 600° C. in a nitrogen atmosphere. The temperature and the time of the heat treatment may be higher and shorter than those mentioned above as long as they do not have effects on the other steps. When the heat treatment is performed at a temperature lower than 600° C., if the heat treatment is performed for a longer time, the crystallization can be effected.

Finally, as shown in FIG. 10E, the doping film 327 on the gate portion is removed by polishing with a polishing agent, alkali colloidal silica, to form source/drain layers 325 and 326. According to the self alignment method mentioned above, the source/drain layer can be formed in the lowermost dimensions as the same as the gate electrode. As a result, integration density can be increased and the resistance and electric capacitance can be reduced between the source and the drain.

The delay time of the CMOS ring oscillator formed of the elements of this embodiment is 15 psec/stage. The delay time of the CMOS ring oscillator formed of conventional elements in accordance with 0.2 μm rule is 30 psec/stage. This fact demonstrates the effect of the present invention in reducing the resistance and electric capacitance between the source and the drain.

As the element isolation method, which is omitted in the above mentioned steps, a general LOCOS element isolation method may be employed. Instead of using the doping film, an impurity such as B, As, or P may be doped in the semiconductor substrate of the source/drain layer, and thereafter, a conductive film such as a metal film and an alloy film may be formed.

(Embodiment 8)

FIGS. 11A–11E are cross sectional views of an MOS transistor, sequentially showing the steps of manufacturing the MOS transistor according to Embodiment 8 of the present invention. This embodiment is the same as Embodiment 7 except that two MOS transistors are isolated.

Figure 11A:
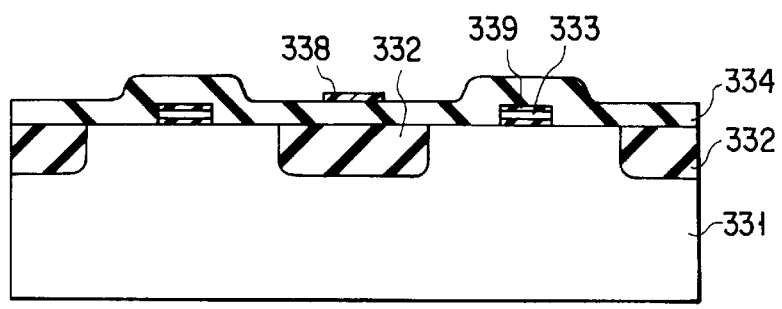
FIGS. 11A–11E are cross sectional views of an MOS transistor, sequentially showing the steps of manufacturing the MOS transistor according to Embodiment 8 of the present invention.

As shown in FIG. 11A, on the silicon substrate 331 with an element isolation film 332 and the gate portion formed therein and on, respectively, an SiO₂ film 334 and a resist mask 338 are sequentially formed. It is preferred that an insulation film such as a silicon nitride film 339 be formed on the gate electrode 333, as shown in the figure. The SiO₂ film 334 is formed in the same thickness of that of the gate portion by the CVD method using TEOS and ozone. The resist mask 338 is formed at a desired isolation region. When the element isolation film 332 is formed with the same height as that of the gate portion, the same effect can be obtained although a circuit design will be limited.

Figure 11B:
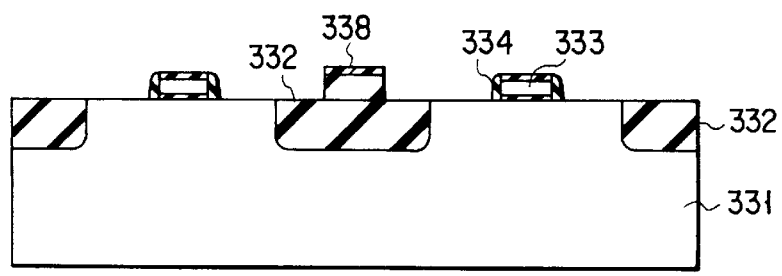

As shown in FIG. 11B, the entire surface is etched by the anisotropic etching. As a result, a SiO₂ film 334 is allowed to remain selectively on the side-wall of the gate portion and at only the lower portion of the resist mask 338.

Figure 11C:
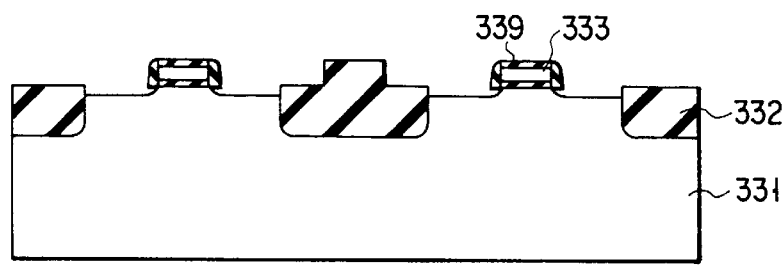
Figure 11D:
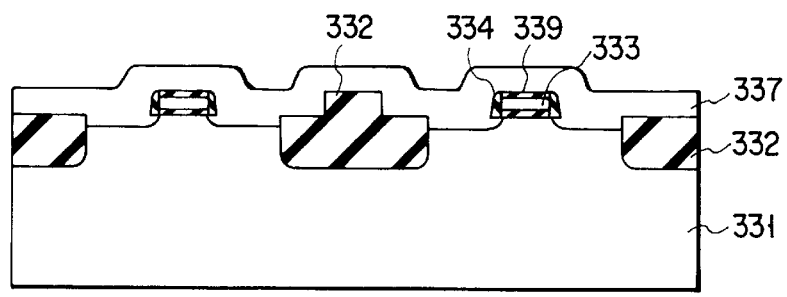

As shown in FIG. 11C, the source/drain region of the silicon substrate 331 is etched by the chemical dry etching method attaining selective silicon etching. When the gate length is 0.1 μm, the etching depth is set to about 0.03 μm. This embodiment employs etching, however, implantation of impurity ions (As, P, or B) into the source/drain region may be employed.

As shown in FIG. 1D, after a doping film 337 is formed of amorphous silicon by the CVD method using a diborane gas and a disilane gas at 350° C., heat treatment is performed at 600° C. for 2 hours in a nitrogen atmosphere, thereby obtaining a single-crystalline film. In this embodiment, the doping film containing boron is used. However, use may be made of another doping film formed of a silicon film containing an impurity other than boron. Furthermore, instead of the doping film, an impurity (B, As, or P) may be implanted in the semiconductor substrate of the source/drain layer, and thereafter a conductive film such as a metal film or an alloy film may be formed thereon.

Figure 11E:
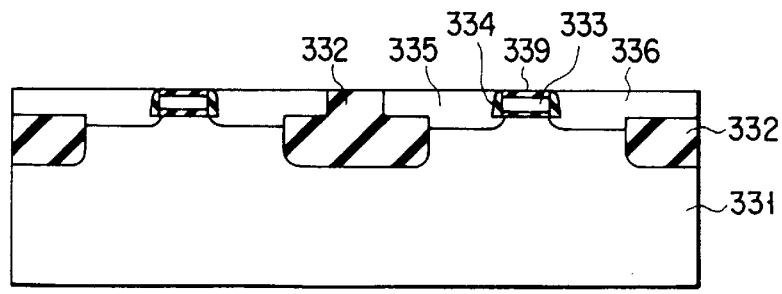

Finally, as shown in FIG. 11E, the doping film 337 on the gate electrode 333 is removed by polishing with a polishing agent, alkali colloidal silica. As a result, source/drain layers 335 and 336 are formed.

In this manner, an MOS transistor can be obtained not only with a gate length of 0.1 μm and a junction depth of 0.03 μm but also with the source/drain layers 335 and 336 obtained by processing the doping film in the same lowermost dimensions as the gate electrode. Each of MOS transistors is separated by a micro-processing technique with the same accuracy as that of the gate. As a result, an individual element region can be reduced to the limit attained by the micro-processing technique.

(Embodiment 9)

FIGS. 12A–12E are cross-sectional views of a MOS transistor, sequentially showing the steps of manufacturing the MOS transistor according to Embodiment 9 of the present invention. In the same as in Embodiment 8, two MOS transistors of this embodiment are not in contact with each other.

A feature different from Embodiment 8 resides in that a gate electrode (pseudo gate electrode) is formed also in the region to be isolated by use of the same mask at the time the gate electrode is formed. In this manner, not only the miniaturization of the gate electrode but also the miniaturization of the source/drain layer can be attained without misalignment.

Figure 12A:
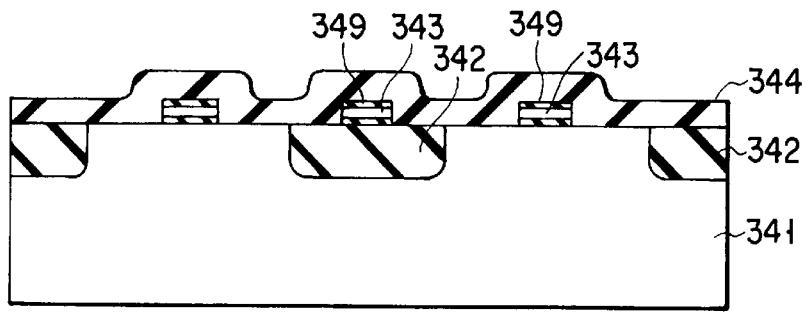
FIGS. 12A–12E are cross sectional views of an MOS transistor, sequentially showing the steps of manufacturing the MOS transistor according to Embodiment 9 of the present invention.

As shown in FIG. 12A, on a silicon substrate 341 with an element isolation film 342 and the gate portion formed therein and on, respectively, an SiO₂ film 344 is formed. It is preferred that an insulation film such as a silicon nitride film 349 be formed on the gate electrode 343 as shown in the figure. The gate length on the gate electrode 343 is formed in the lowermost dimensions. The gate electrode 343 may be formed also on an element isolation film 342. To be more precisely, this gate electrode 343 (pseudo gate electrode 343) is inevitably formed at the same time the gate electrode of each MOS transistor is formed. Therefore, the pseudo gate electrode does not have the function as the gate electrode.

Figure 12B:
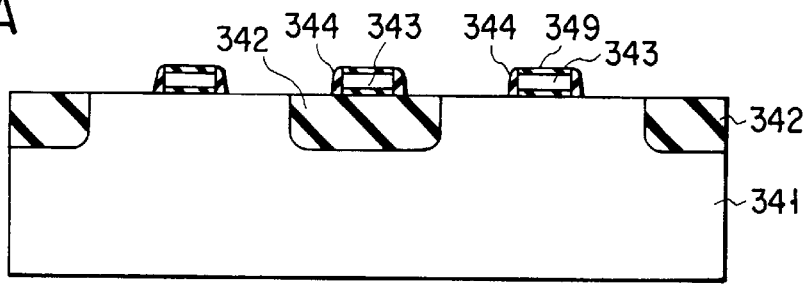
Figure 12C:
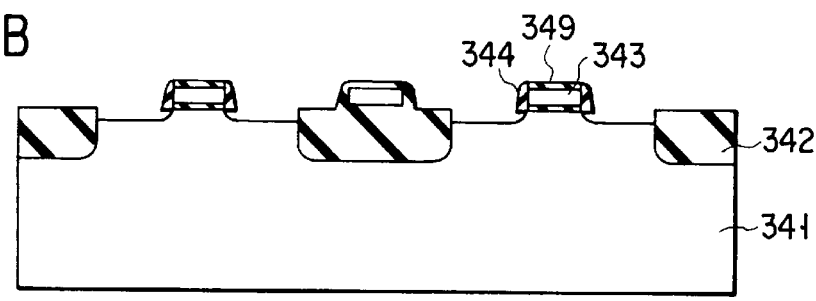

As shown in FIG. 12B, the SiO₂ film 344 is left selectively on the side wall of the gate portion. Thereafter, as shown in FIG. 12C, the source/drain region of the silicon substrate 341 is selectively etched by the chemical dry etching. Instead of etching the substrate, impurity ions (As, P, or B) may be implanted in the substrate surface to form the source/drain region.

Figure 12D:
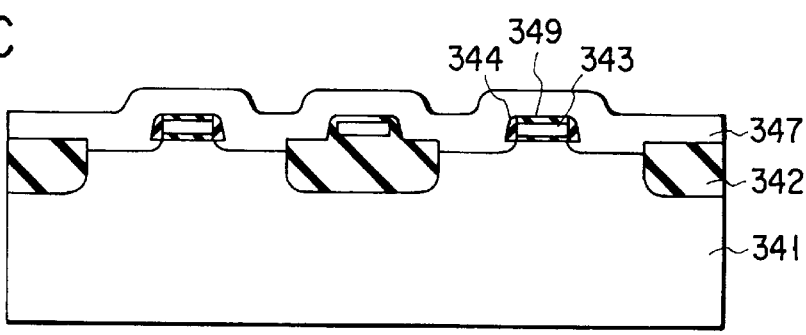
Figure 12E:
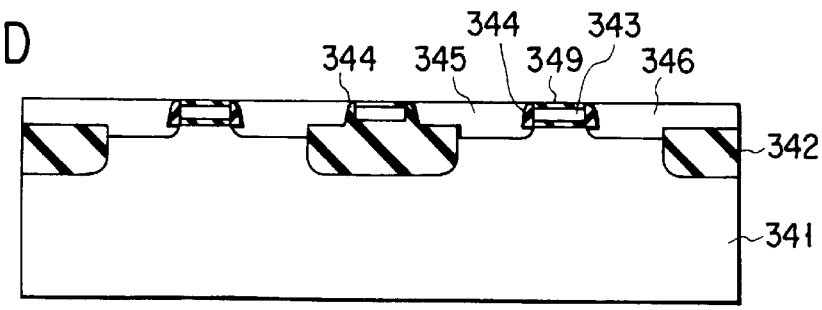

As shown FIG. 12D, a doping film 347 is deposited over the entire surface. Subsequently, as shown in FIG. 12E, the protruding portion of the doping film 347 is polished and the surface thereof is flattened. In this case, the gate electrode 344 on the element isolation film 342 is covered with an insulation film, so that doping films 345 and 346 on either side are is electrically isolated. Through this step, MOS transistors are separated into two.

(Embodiment 10)

Figure 13F:
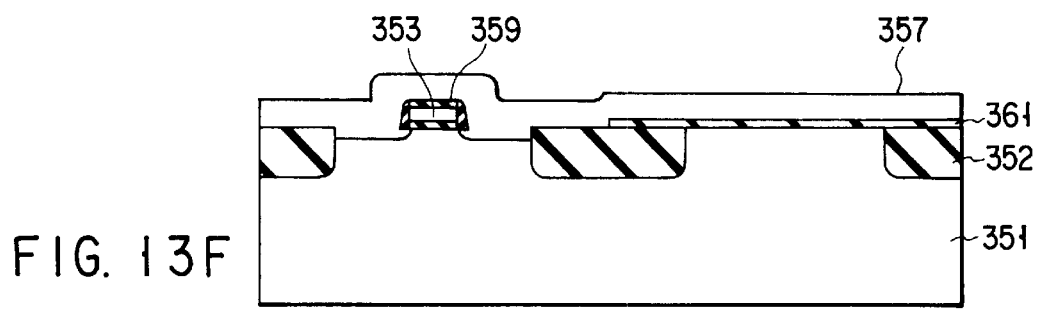
FIGS. 13A–13Q are cross sectional views of an MOS transistor, sequentially showing the steps of manufacturing the MOS transistor according to Embodiment 10 of the present invention.
Figure 13G:
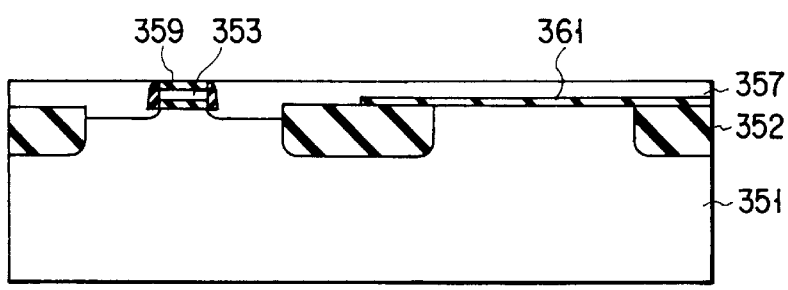
Figure 13H:
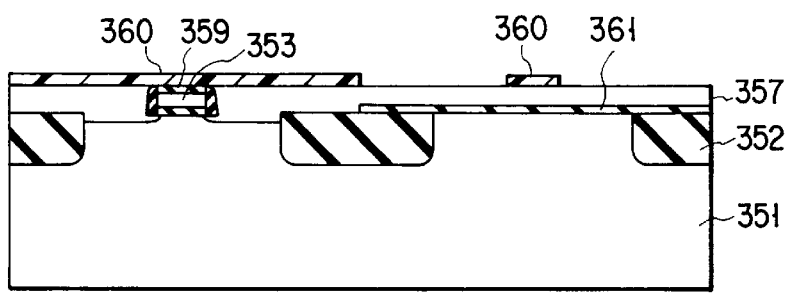
Figure 13I:
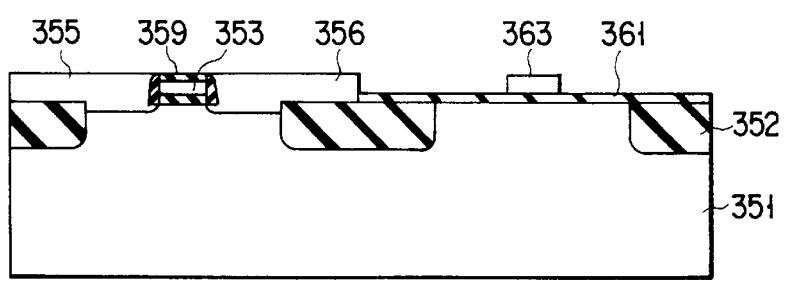
Figure 13J:
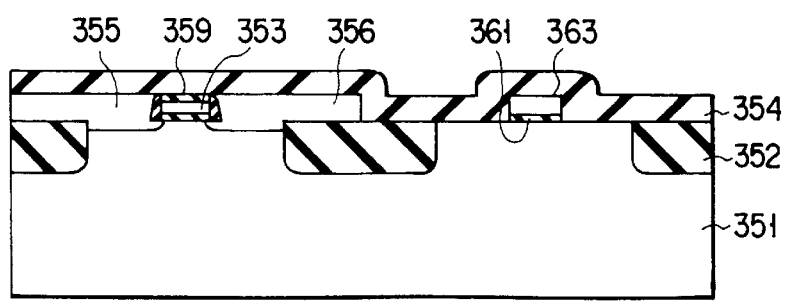
Figure 13K:
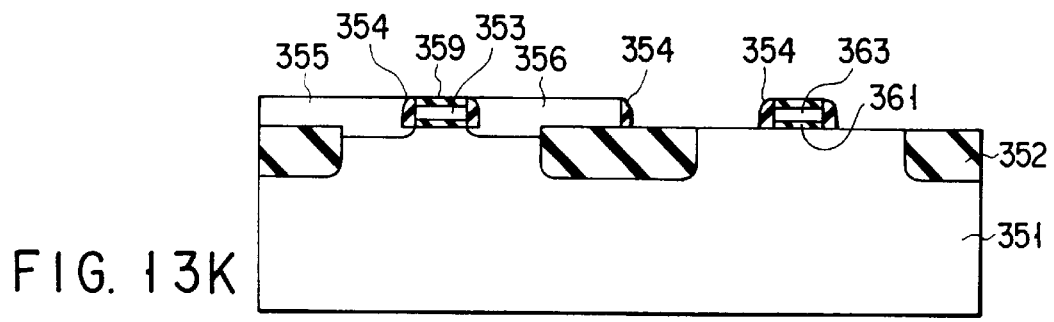
Figure 13L:
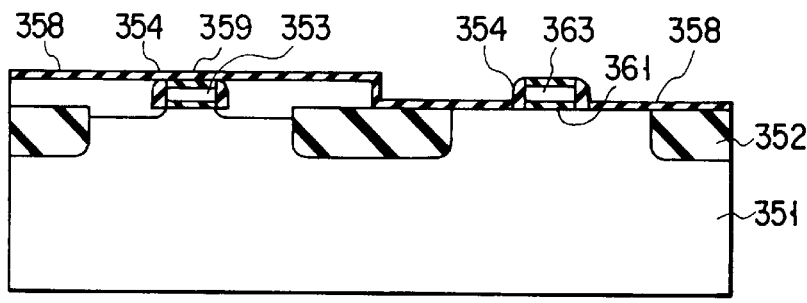
Figure 13M:
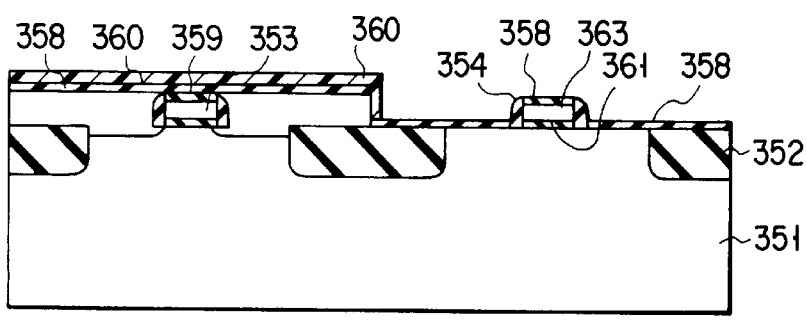
Figure 13N:
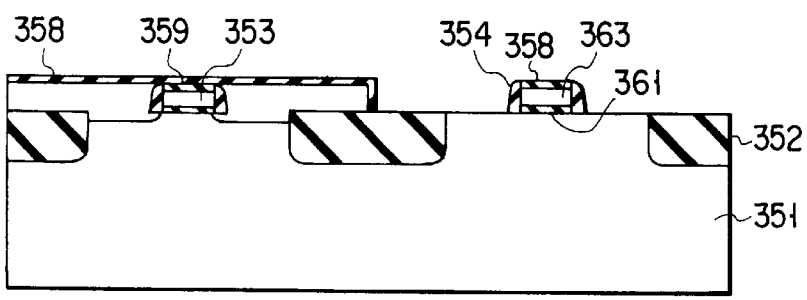
Figure 13O:
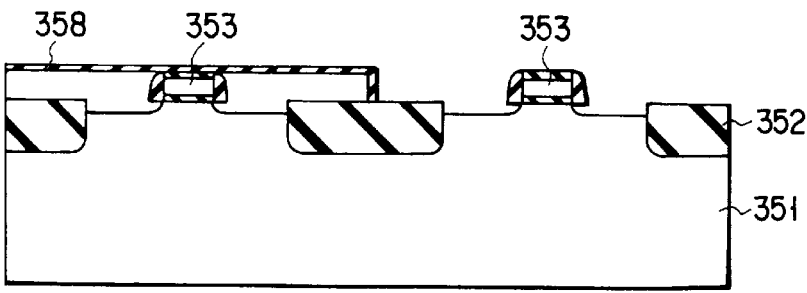
Figure 13P:
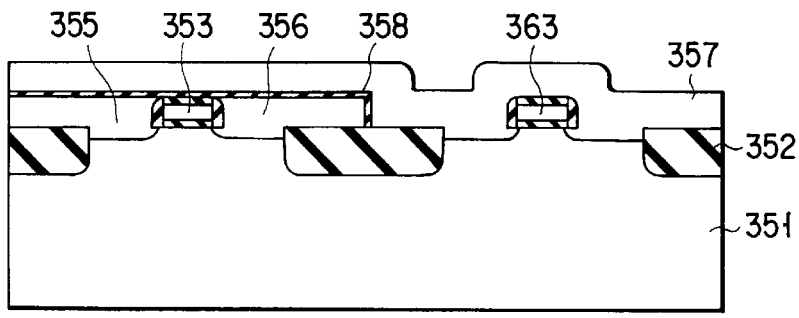
Figure 13Q:
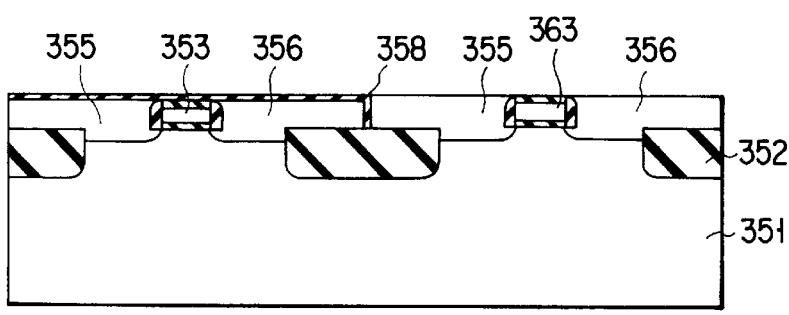

FIGS. 13A–13Q are cross sectional views of an MOS transistor, sequentially showing the steps of manufacturing the MOS transistor according to Embodiment 10 of the present invention. In this embodiment, two or more transistor source/drain regions of are simultaneously formed.

As shown in FIG. 13A, an SiO$_2$ film 354 is formed on a silicon substrate 351 with an element isolation film 352 and the gate portion of a first MOS transistor formed therein and on, respectively. It is preferred that an insulation film such as a silicon nitride film 359 be formed on the gate electrode 353.

As shown in FIG. 13B, an insulation film 354 is formed selectively on the side wall of the gate electrode 353 by anisotropic etching. Thereafter, as shown in FIG. 13C, after a gate oxidation film 361 of a second MOS transistor is formed, the second MOS transistor formation region is covered with a resist 360. Before the gate oxidation film 361 is formed, generally-performed pseudo oxidation may be carried out.

As shown in FIG. 13D, after the gate oxidation film 361 of the first MOS transistor region is selectively removed by the RIE method or with a hydrofluoric acid or an aqueous solution of ammonium fluoride, the resist 360 is removed. Subsequently, as shown in FIG. 13E, the source/drain region of the first MOS transistor of the silicon substrate 351 is removed by etching. Instead of etching removal of the source/drain region, impurity ions(P, As or B) may be implanted in the substrate surface of the source/drain region. In the case of ion implantation, it is better to employ a method of injecting ions before the resist 360 is removed in the step shown in FIG. 13D, because this method can prevent the ions from being implanted into the portion under the gate oxidation film of the second MOS transistor.

As shown in FIG. 13F, a doping film 367 is formed over the entire surface. As the doping film 367, use may be made of a silicon film doped with boron (p-type impurity), arsenic (n-type impurity), or phosphorus (n-type impurity) by the CVD method. In the case where a source/drain region is formed by impurity-ion implantation in the substrate surface, a conductive film may be used in place of the doping film.

As shown in FIG. 13G, the doping film 367 on the gate portion is removed by polishing. Subsequently, as shown in FIG. 13H, a resist mask 360 covering the first MOS transistor and a resist mask 360 covering the gate portion of the second MOS transistor are formed. The resist mask 360 must be cut on the element isolation film 352, no matter where on the film 352, so that a problem of misalignment will not take place.

As shown in FIG. 13I, the doping film 357 is etched by the anisotropic etching with the resist mask 360 as a mask. As a result, source/drain layers 355 and 356 of a first MOS transistor and the gate electrode 363 of the second MOS transistor are formed. At this time, the etching may be stopped by the gate oxide film 361 used as an etching stopper or may be continued until the gate oxide film 361 is removed.

As shown in FIG. 13J, an insulation film 354 is formed over the entire surface. Subsequently, as shown in FIG. 13K, the entire surface of the insulation film 354 is etched by the anisotropic etching. As a result, the insulation film 354 is selectively left on the side wall of the gate portion of a second MOS transistor and on the side wall of the source/drain layer 356 of the first MOS transistor.

As shown in FIG. 13L, an insulation film 358 is formed over the entire surface. The insulation film 358 is used as a stopper during a polishing step (FIG. 13Q) performed later. Then, as shown in FIG. 13K, the resist 360 is formed on the first MOS transistor formation region. The resist must be cut on the element isolation film 352 no matter where on the film 352, so that a misalignment problem will not take place.

As shown in FIG. 13N, an insulation film 358 on the second MOS transistor region is removed by the reactive ion etching, chemical dry etching, or wet etching using hydrofluoric acid series aqueous solution, by use of the resist 360 as a mask, and thereafter, the resist 360 is removed.

As shown in FIG. 13O, the source/drain region of the second MOS transistor on the silicon substrate 351 is etched by means of chemical dry etching or the like. Instead of etching the source/drain region, an impurity (P, As, or B) may be implanted in the substrate surface of the source/drain region.

As shown in FIG. 13P, the doping film 357 is formed over the entire surface. As the doping film 357, it is preferable to use a silicon film doped with boron (p-type impurity), arsenic (n-type impurity), or phosphorus (n-type impurity) by the CVID method. When the source/drain region is formed by implanting impurity ions in the substrate surface, a conductive film may be used in place of the doping film.

As shown in FIG. 13Q, the doping film 357 on the gate portions of the first and second MOS transistors is removed by polishing. As a result, the source/drain layers 355 and 356 of the second MOS transistor are formed, at the same time, the first and the second MOS transistors are electrically isolated from each other.

In the aforementioned method, to connect the source/drain layer 356 of the first MOS transistor to the gate electrode 363 of the second MOS transistor, an interlayer insulation film is further required with a contact hole provided therein. By way of an aluminium electrode or the like, the source/drain layer 356 is connected to the gate electrode 363.

Figure 14A:
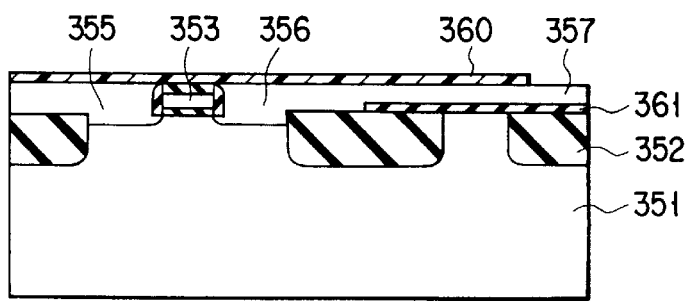
FIGS. 14A and 14B are cross sectional views of an MOS transistor showing a modified example of Embodiment 10 of the present invention.

To connect the source/drain layer 356 to the gate electrode 363 without the use of the interlayer insulation film, contact hole, and aluminium electrode, use may be preferably made of the resist 360 having a pattern shown in FIG. 14A, in other words, the resist 360 extending over the doping film 357 of the second MOS transistor, instead of the resist 360 having a pattern shown in FIG, 13H. In this manner, it is possible to form an element structure having the source/drain layer 356 of the first MOS transistor connected to the gate electrode 363 of the second MOS transistor.

Figure 14B:
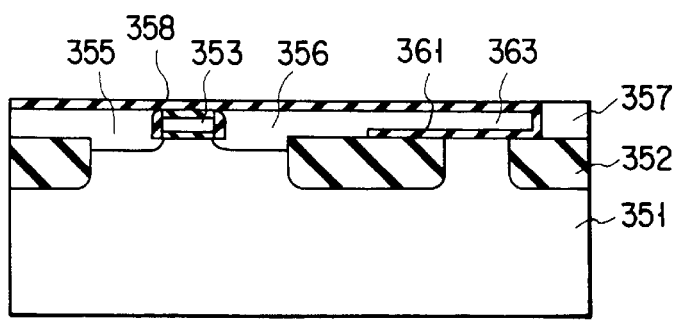

In the case of an SRAM using a CMOS inverter characterized by the structure having a drain of an MOS transistor connected to a gate of another MOS transistor, the manufacturing steps can be shortened and simplified by employing the method shown in FIGS. 14A and 14B. It should be noted, in FIGS. 14A and 14B, that the cross sectional view of the first MOS transistor positioned on the left-hand side is parallel to the channel, whereas, the cross sectional view of the second MOS transistor positioned on the right-hand side is perpendicular to the channel. That is, in the transistor positioned on the right-hand side, the source/drain layer is positioned in the perpendicular direction to the face of the paper.

(Embodiment 11)

FIGS. 15A–15L are cross sectional views of a CMOS transistor, sequentially showing the steps of manufacturing the CMOS transistor according to Embodiment 11 of the present invention.

Figure 15A:
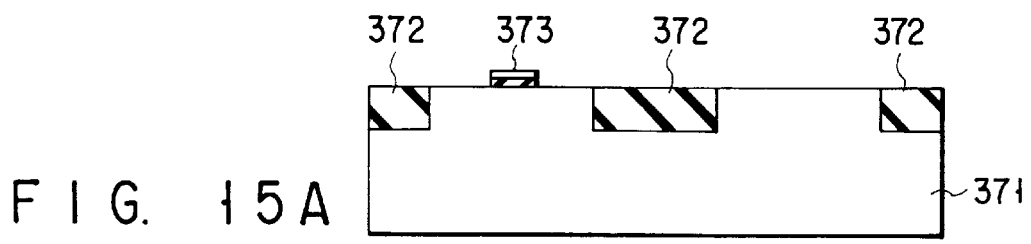
FIGS. 15A–15L are cross sectional views of an MOS transistor, sequentially showing the steps of manufacturing the MOS transistor according to Embodiment 11 of the present invention.

As shown in FIG. 15A, a gate portion 373 of an n-channel MOS transistor consisting of a gate insulation film and a gate electrode (polysilicon), is formed on a silicon substrate 371 with an element isolation film 372 formed therein. Before elements are isolated in accordance with a general MOS process, that is, before the gate oxidation film is formed, a pseudo oxidation film or a nitride film (not shown) is formed. In this embodiment, the steps of forming an n-channel MOS transistor in the first place, will be described, however, a p-channel MOS transistor may be formed first.

Figure 15B:
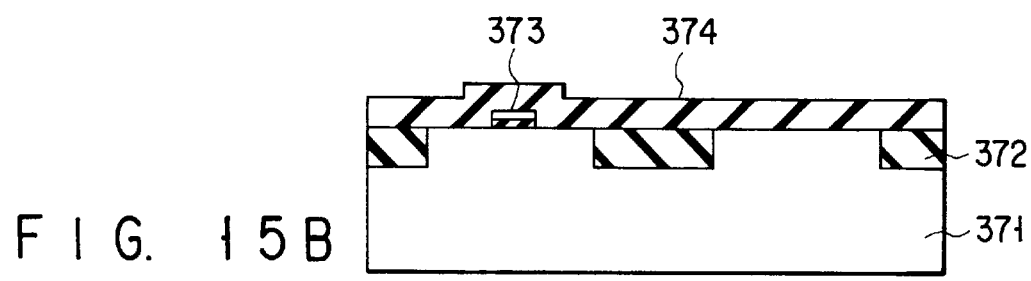
Figure 15C:
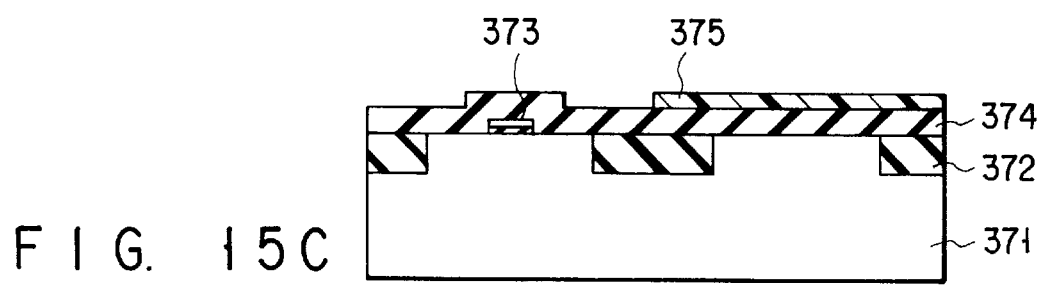

As shown in FIG. 15B, a silicon oxide film 374 is formed in a thickness equal to or larger than that of the gate portion 373. Thereafter, as shown in FIG. 15C a resist 375 is formed in a p-channel MOS transistor formation region.

Figure 15D:
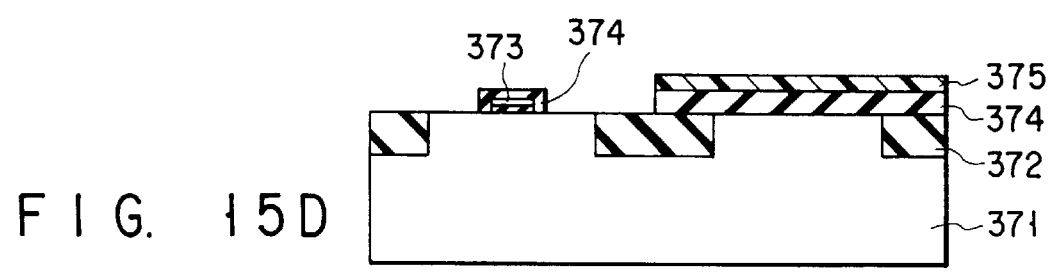

As shown in FIG. 15D, the entire surface of the silicon oxide film 374 is etched by the RIE method using the resist 375 as a mask. A silicon oxide film 374 is left selectively on the side wall and the upper surface of the gate portion 373 and the lower portion of the resist 375.

Figure 15E:
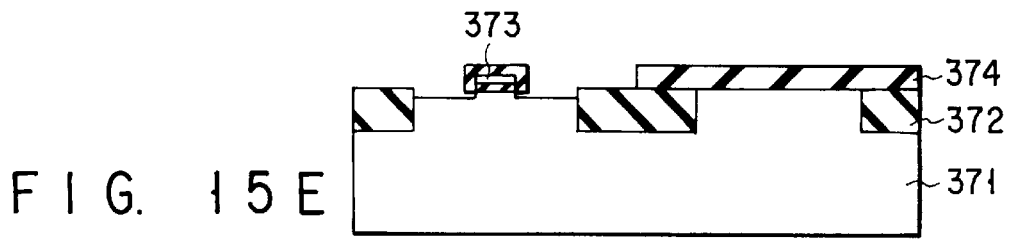

As shown in FIG. 15E, the surface of the silicon substrate 371 of the source/drain region of the n-channel MOS transistor is etched. Instead of etching the source/drain region, phosphorus or arsenic ions may be implanted in the substrate surface of the source/drain region.

Figure 15F:
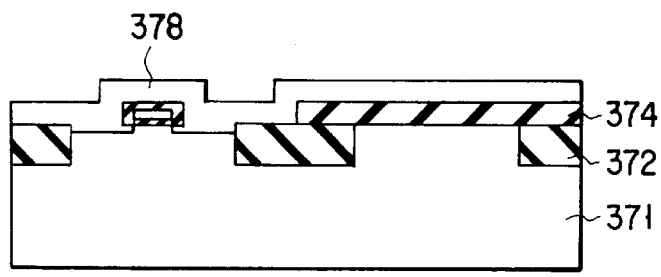

As shown in FIG. 15F, a doping film 378, which is a phosphorus-doped or arsenic-doped amorphous state or a polycrystalline state silicon film, is formed over the entire surface. When the amorphous state doping film is used, heating may be simultaneously applied to the doping film to crystallize it.

Figure 15G:
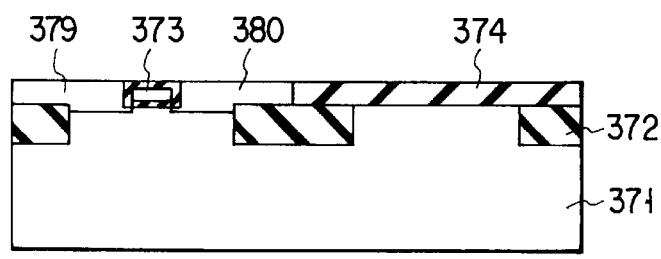
Figure 15H:
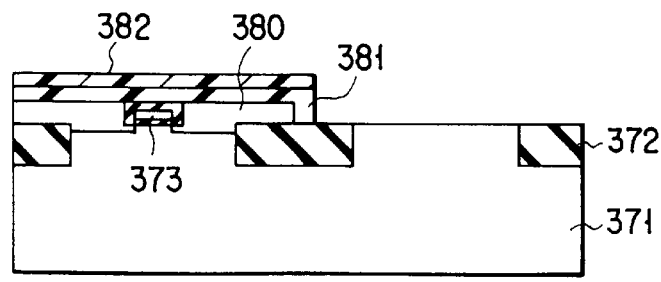

As shown in FIG. 15G, the silicon oxide film 374 and the doping film 378 on the gate portion are removed by polishing to form the source/drain diffusion layers 379 and 380. Subsequently, as shown in FIG. 15H, a silicon oxide film 381 is formed over the entire substrate surface, a resist 382 is formed on the n-channel MOS transistor region. Using the resist 382 as a mask, the silicon oxide film 374 of a pMOS transistor is removed by etching. At this point, the silicon oxide film 374 remains on the side wall of the source/drain diffusion layer 380. This is because the resist 382 is also present above the outer side of the side wall of the source/drain diffusion layer 380.

Figure 15I:
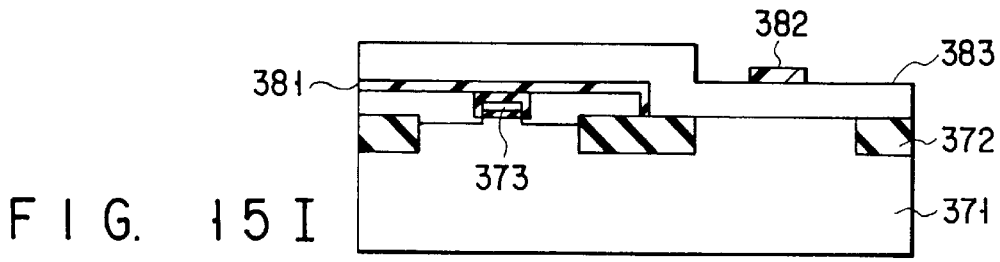

As shown in FIG. 15I, after a gate insulation film (not shown) of the p-channel MOS transistor is formed, a semiconductor film or a conductive film 383, which will serve as the gate electrode of the p-channel MOS transistor, is formed over the entire surface. Thereafter, the resist 382 is formed on the gate insulation film corresponding to the gate region of the p-channel MOS transistor.

Figure 15J:
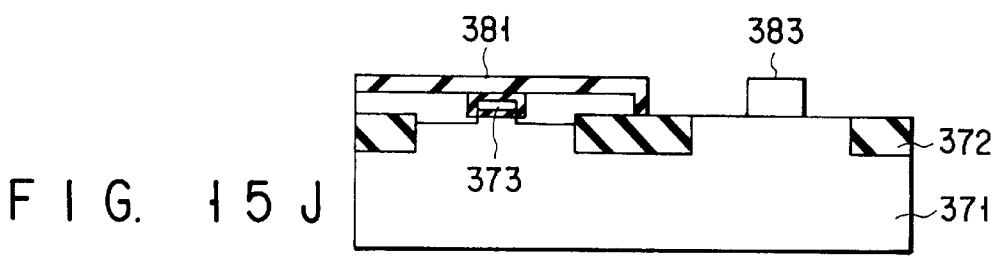

As shown in FIG. 15J, the semiconductor film or the conductive film 383 is etched by the RIE method using the resist 382 as a mask. Consequently, a gate electrode 383 of the p-channel MOS transistor is formed. It is preferable that a silicon nitride film be formed on the gate electrode 383.

Figure 15K:
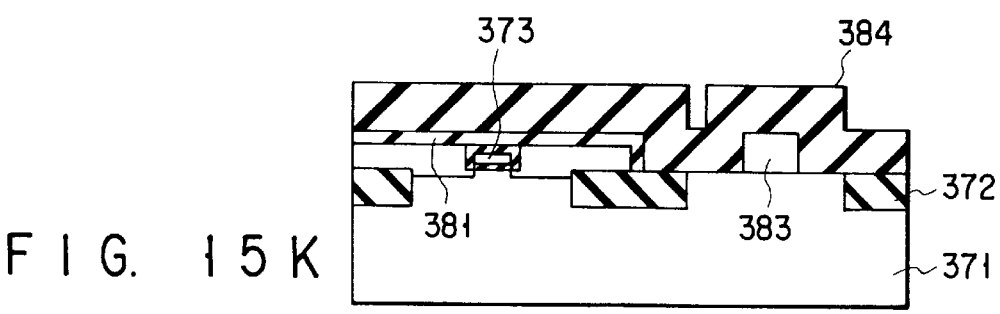
Figure 15L:
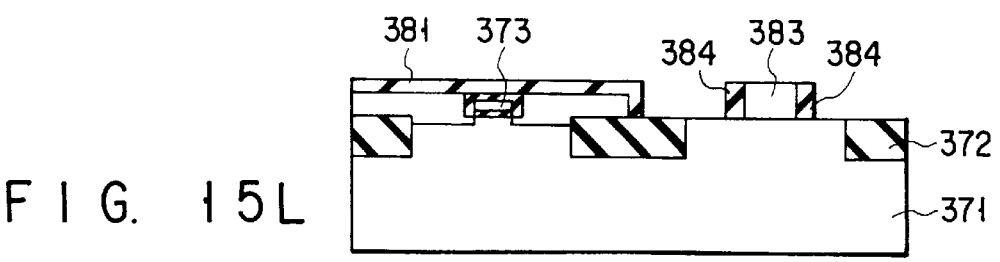

As shown in FIG. 15K, a silicon oxide film 384 is formed over the entire surface in a thickness equal to or more than that of the gate portion (consisting of a gate insulation film (not shown) and a gate electrode 383. Subsequently, as shown in FIG. 15L, the entire surface of the silicon oxide film 384 is etched by means of the RIE method. Consequently, the silicon oxide film 384 is selectively left on the side wall of the gate portion.

Then, a doping film is formed in the same manner as shown in FIGS. 15E–15G to form a source/drain layer, thereby forming a p-channel MOS transistor. The doping film used herein contains p-type impurity such as boron. The impurity may be doped either simultaneously with or after the film formation.
(Embodiment 12)

FIGS. 16A–16D are plan views of en MOS transistor, sequentially showing the steps of manufacturing the MOS transistor according to Embodiment 12 of the present invention. In this embodiment, the upper surface of the gate electrode and the surface of the source/drain electrode are formed in the same plane and the source/drain electrode is formed next to the gate electrode in the self-alignment manner.

Figure 16A:
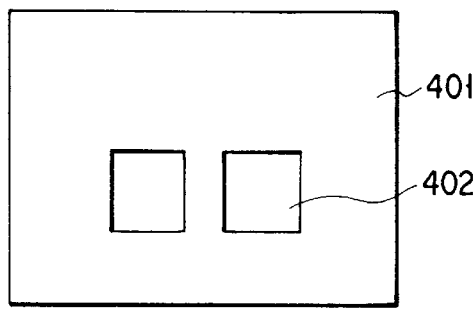
FIGS. 16A–16D are plan views of an MOS transistor, sequentially showing the steps of manufacturing the MOS transistor according to Embodiment 12 of the present invention.

First, a silicon substrate 402 is prepared with an insulation film 401 formed over the entire surface. Then, the insulation film 401 of the source/drain region is removed as shown in FIG. 16A to expose the surface of the silicon substrate 402.

Figure 16B:
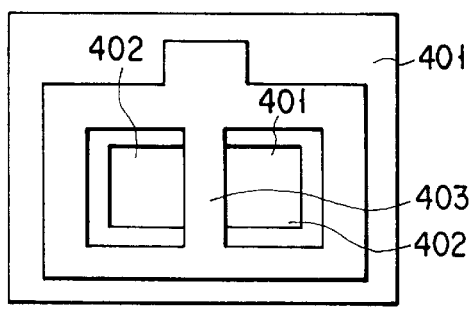

As shown in FIG. 16B, after a semiconductor film or a conductive film serving as a gate electrode 403 is deposited over the entire surface, the semiconductor film or conductive film are processed by use of a miniaturization processing technique. Consequently, a gate electrode 403 is formed surrounding the surface region 402 of the substrate, which will serve as source/drain region. When the source/drain region is connected to the source/drain region or the gate electrode of another element, it is better to remove part of the gate electrode 403 surrourding the source/drain so as to obtain the cross section shown in Embodiments 5 or 8.

Figure 16C:
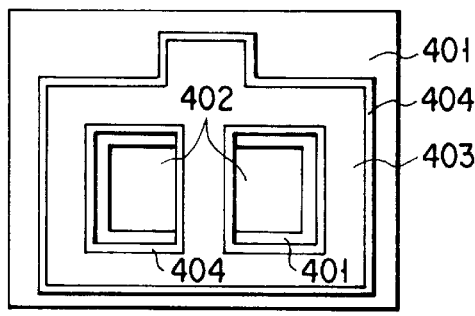

As shown in FIG. 16C, an insulation film which will be the side-wall gate insulation film 404 is deposited over the entire surface in a thickness equal to or more than that of the gate electrode 403. After the entire surface of the insulation film is etched by anisotropic etching to remove the insulation film except for the side wall of the gate electrode 403, a side-wall gate insulation film 404 is formed. Note that the insulation film may be left on the gate electrode 403.

Figure 16D:
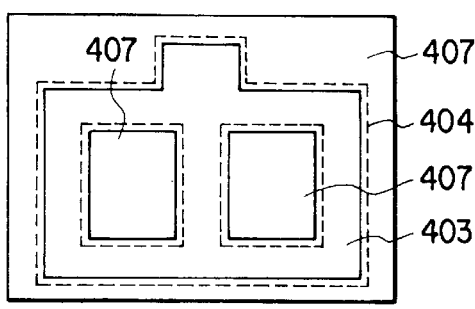

As shown in FIG. 16D, after a semiconductor film and a conductive film which will be the source/drain layer 407 is deposited over the entire surface, the semiconductor film or the conductive film on the gate electrode 403 is removed by polishing.

As a result, two source/drain electrodes 407 are formed next to the gate electrode 403 in a self-alignment manner with the side-wall insulation film 404 interposed therein. The two source/drain electrodes 407 are electrically isolated to each other. The semiconductor film or conductive film which remains on the outer region of the gate electrode 403, is electrically isolated from the source/drain electrode 407.
(Embodiment 13)

FIGS. 17A–17D are plan views of an MOS transistor, sequentially showing the steps of manufacturing the MOS transistor according to Embodiment 13 of the present invention. In this embodiment, the upper surface of the gate electrode and the surface of the source/drain electrode are formed in the same plane by using a general gate pattern, and the source/drain electrode is formed next to the gate electrode in the self-alignment manner.

Figure 17A:
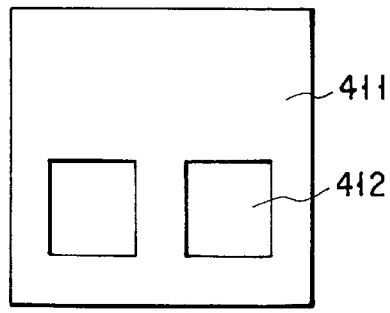
FIGS. 17A–17D are plan views of an MOS transistor, sequentially showing the steps of manufacturing the MOS transistor according to Embodiment 13 of the present invention.

First, a silicon substrate 412 is prepared with an insulation film 411 formed over the entire surface. Then, the insulation film 411 of the source/drain region is removed (as shown in FIG. 17A) to expose the surface of the silicon substrate 412.

Figure 17B:
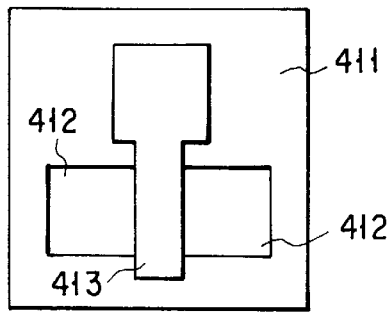

As shown in FIG. 17B, after a semiconductor film or a conductive film, which will serve as a gate electrode 403, is deposited over the entire surface, the semiconductor film or conductive film are processed by use of a miniaturization processing technique. Consequently, a gate electrode 413 having a general pattern is formed.

Figure 17C:
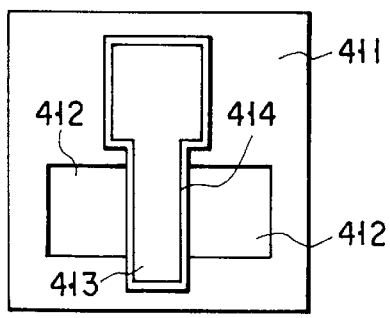

As shown in FIG. 17C, an insulation film which will serve as the side-wall gate insulation film 414 is deposited over the entire surface in a thickness equal to or more than that of the gate electrode 413. After the entire surface of the insulation film is etched by the anisotropic etching to remove the insulation film except for the side wall of the gate electrode 413, a side-wall gate insulation film 414 is formed. Note that the insulation film may be left on the gate electrode 413.

Figure 17D:
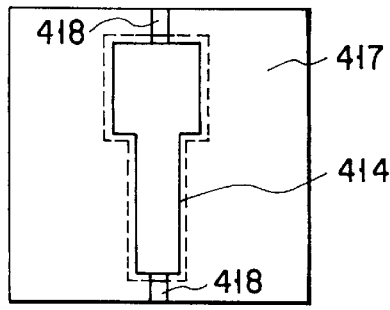

As shown in FIG. 17D, after a semiconductor film and a conductive film, which will serve as the source/drain layer 417, are deposited over the entire surface, the semiconductor film or the conductive film on the gate electrode 413 is removed by polishing. As a result, the semiconductor film or conductive film 417 is electrically isolated from the gate electrode 413. Note that the semiconductor film 417 is not divided into two portions in this stage. Afterwards, the semiconductor film or conductive film is separated by forming an isolation layer 418 to form two source/drain layers. (Embodiment 14)

Figure 18A:
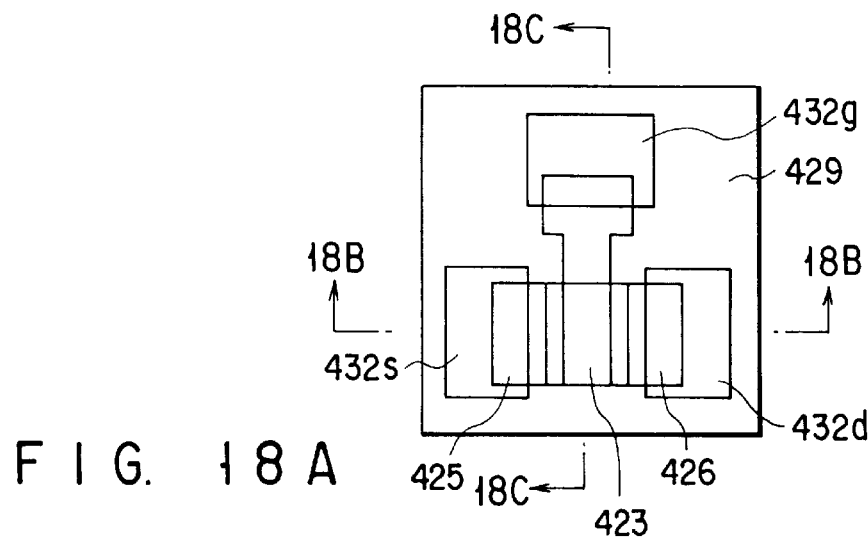
FIG. 18A is a schematic plan view showing a MOS transistor according to Embodiment 14 of the present invention.
Figure 18B:
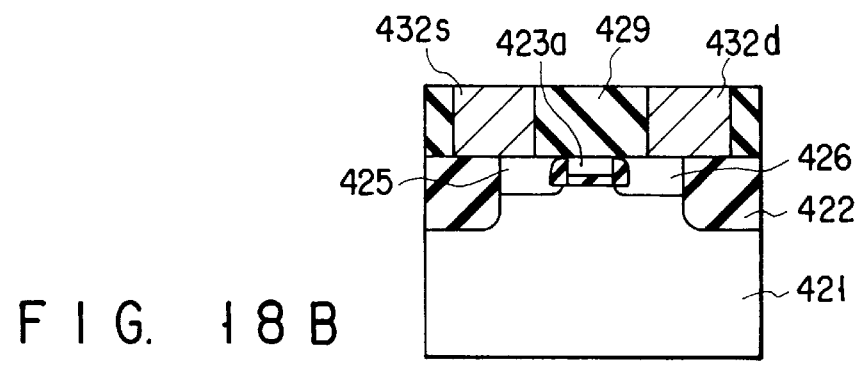
FIG. 18B is a cross sectional view taken along the line 18B–18B of FIG. 18A.
Figure 18C:
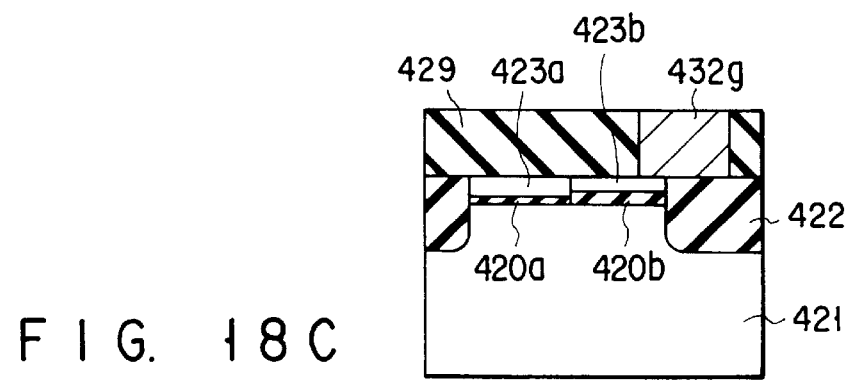
FIG. 18C is a cross sectional view taken along the line 18C–18C of FIG. 18A.

FIGS. 18A–18C are views for use in explaining an MOS transistor according to Embodiment 14 of the present invention. FIG. 18A is a schematic plan view showing layered mask patterns responsible for the formation of individual regions of the transistor. The cross sectional structure of the MOS transistor can be figured out if FIGS. 18B and 18C are referred to together.

In FIGS. 18A–18C, reference numeral 421 is a silicon substrate in which an element isolation film 422 is buried. After a gate electrode 423a is formed, the portion of the substrate with a semiconductor film buried therein, is polished, thereby forming source/drain layers 425 and 426. The polishing is performed so as to stop at the upper surface of the element isolation film 422 and the upper surface of the gate portion. The source/drain region may be formed by implanting impurity ions into the substrate surface in place of burying the semiconductor film.

In an interlayer insulation film 429, contact holes are provided in which upper-layer, wiring elements 432g, 432s, and 432d are individually buried. In FIGS. 18B and 18C, these upper-layer wiring elements are completely buried in the interlayer insulation film 429, however, they may be formed in a thin-film form. If necessary, the upper wiring element 432 may be left on the interlayer insulation film 429 for example, by mask processing.

As shown in FIG. 18C, insulation Films 420a and 420b present under the gate electrode 423a and the gate wiring 423b differ in thickness. It is preferable that the insulation film 420b of the gate wiring be thicker than the insulation film 420a of the gate electrode. For example, the thickness of the insulation film 420a is set to 5 nm and thickness of the insulation film 420b is set to 100 nm. As the insulation films 420a and 420b, an oxide film and a nitride film are employed.

The gate electrode 423a and the source/drain layers 425, 426 are processed in the lowermost width applicable for LSI manufacturing. The opening width of the wiring groove of the upper-layer wiring 432 may be wider than the lowermost processing width and may include a margin for misalignment.

FIGS. 19A, 19B, 20A, and 20B are views for use in explaining a basic concept for manufacturing the MOS transistor of this embodiment.

Figure 19A:
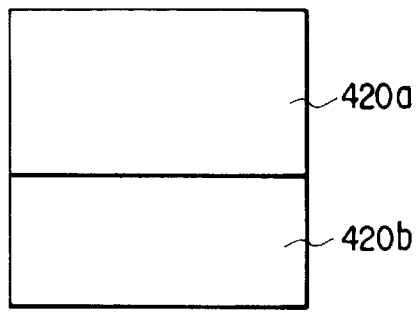
FIGS. 19A and 19B are plan views of a transistor for explaining the basic concept for the construction of the MOS transistor according to Embodiment 14.
Figure 19B:
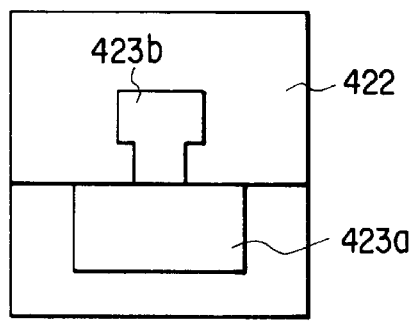

In the method shown in FIGS. 19A and 19B, the insulation films 420a are and 420b different in thickness are first formed (FIG. 19A), and then, a gate electrode 423a and a gate wiring 432b are formed (FIG. 19B).

Figure 20A:
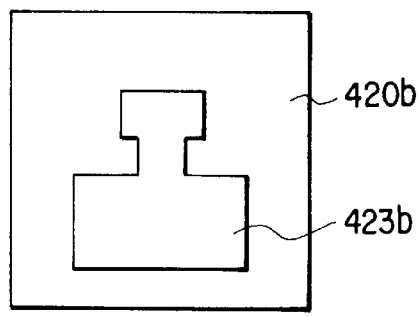
FIGS. 20A and 20B are plan views of a transistor for explaining the basic concept for the another construction of the MOS transistor according to Embodiment 14.
Figure 20B:
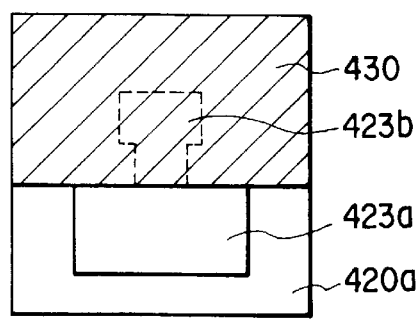

In the method shown in FIGS. 20A and 20B, the thicker 420b is formed over the entire surface, and then the wiring 423b is formed in a gate electrode formation region and in the gate wiring region (FIG. 20A). Afterwards, the gate wiring region is covered with a resist mask 430 and the wiring 423b and the insulation film 420b are removed by etching, thereby forming a thin insulation film 420a and the gate electrode 423a.

Figure 21A:
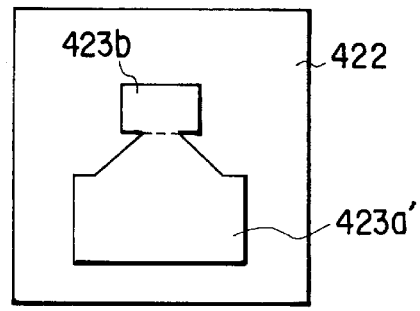
FIGS. 21A to 21C are plan views of a transistor showing the method for reducing the difference in gate length caused by the alignment error between a gate electrode and a mask for source/drain formation.
Figure 21B:
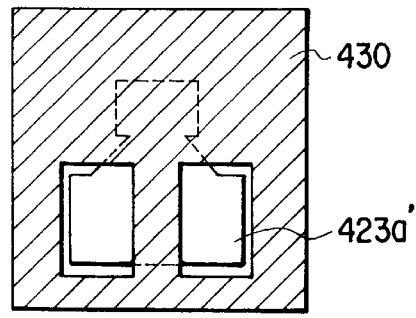
Figure 21C:
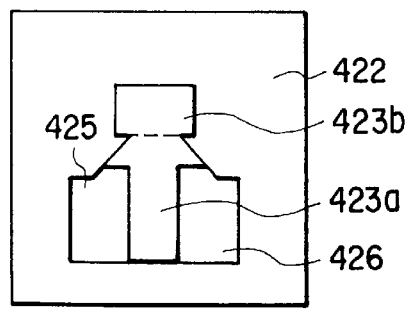

FIGS. 21A–21C show a method of lowering variations in gate length due to misalignment between the gate electrode and the mask for the source,drain formation.

As shown in FIG. 21A, an element isolation film 422, a gate electrode 423a', and a gate wiring 423b are formed on a silicon substrate. The portion of the gate electrode 423a' connecting to the gate wiring 432b is formed in the form of a taper with an angle of 45°. In this stage, a desired gate electrode has not yet been made.

As shown in FIG. 21B, a resist mask 430 for use in forming the source/drain region, is formed on the substrate.

As shown in FIG. 21C, the exposed portion of the gate electrode 423a' is etched by use of a resist mask 430. As a result, the silicon substrate is exposed. Since the portion of the gate electrode 423a' connecting to the gate wiring 423b is formed in the form of a taper, there is small variation in the gate length even if the resist mask 430 shifts in the lateral direction. In this step, the desired gate electrode 423a is made.

Figure 22A:
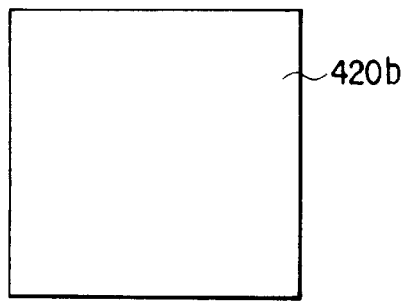
FIGS. 22A to 22U are plan views of a MOS transistor sequentially showing the details of a method of forming the MOS transistor shown in FIGS. 19A and 19B.
Figure 22E:
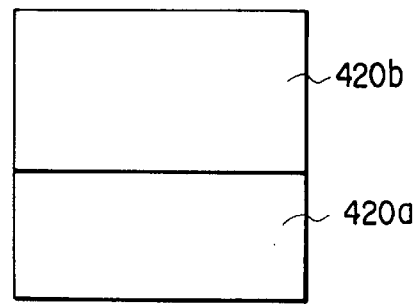
Figure 22B:
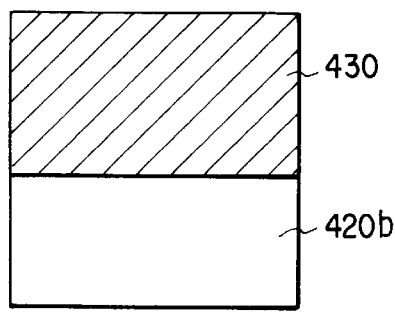
Figure 22F:
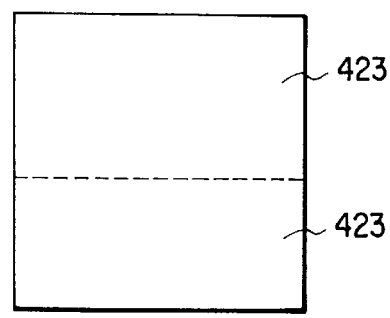
Figure 22C:
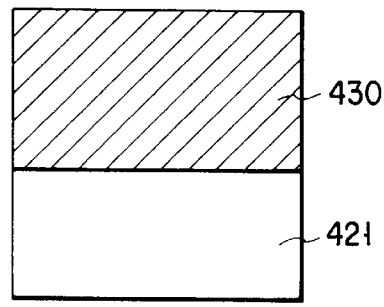
Figure 22G:
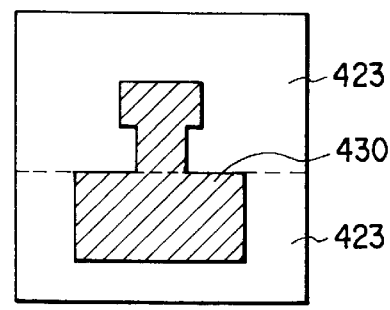
Figure 22D:
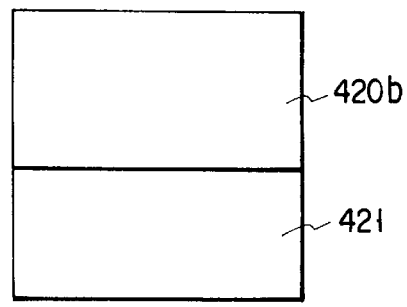
Figure 22H:
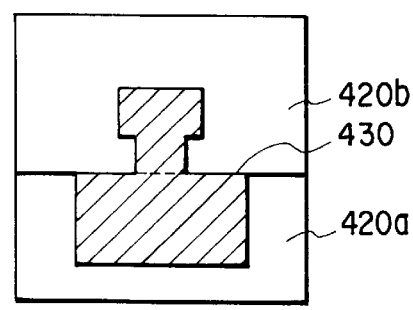
Figure 22I:
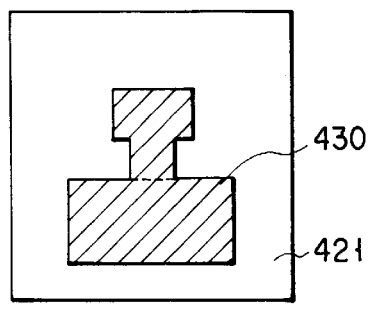
Figure 22M:
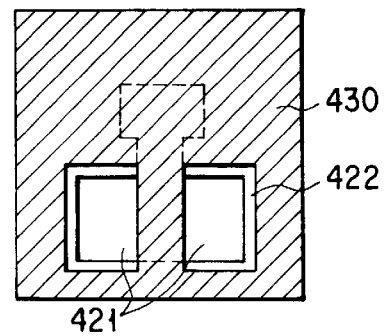
Figure 22J:
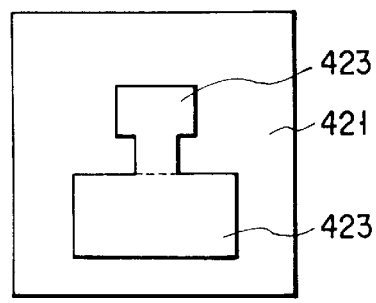
Figure 22N:
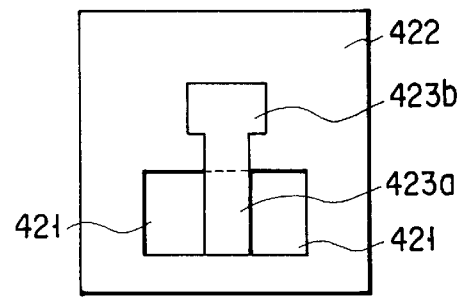
Figure 22K:
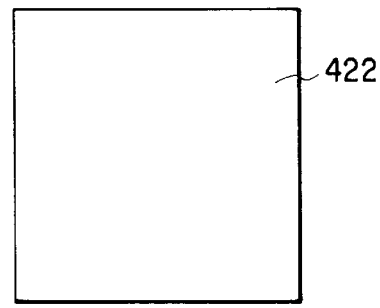
Figure 22O:
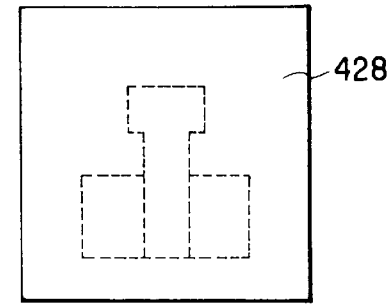
Figure 22L:
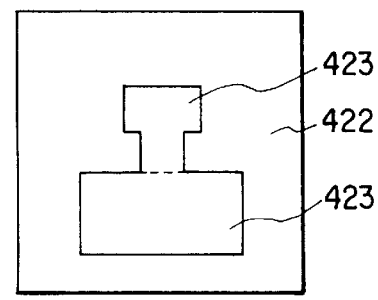
Figure 22P:
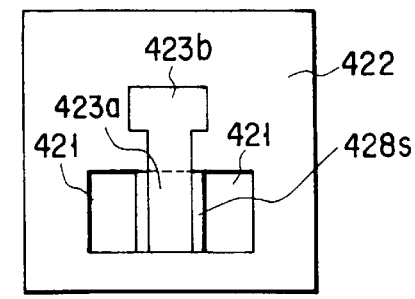
Figure 22Q:
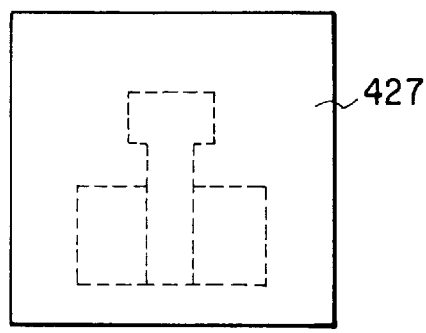
Figure 22R:
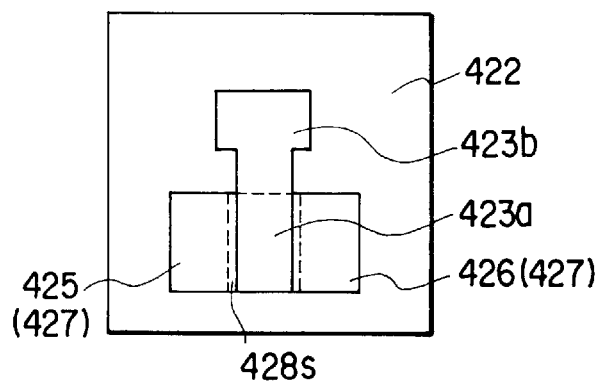
Figure 22S:
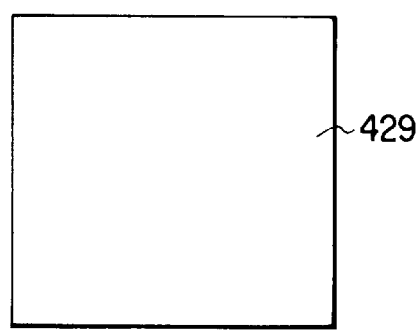
Figure 22T:
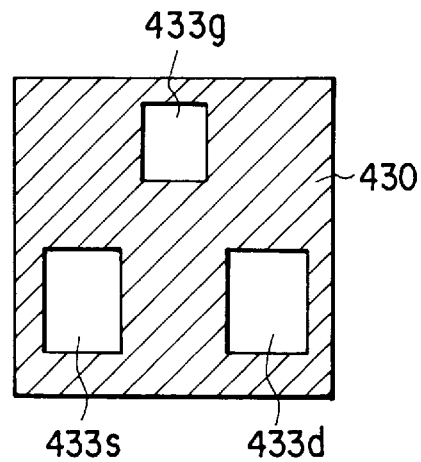
Figure 22U:
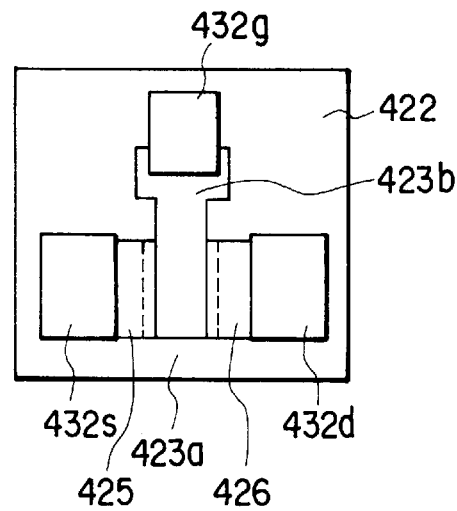

FIGS. 22A–22U are plan views of the transistor, sequentially showing the details of the method shown in FIGS. 19A and 19B.

As show in FIG. 22A, a gate insulation film 420b is formed on a silicon substrate (not shown) in a thickness of 100 nm by the CVD method, the thermal oxidation method, or the like.

As shown in FIG. 22B, a resist mask 430 is formed on the insulation film 420b of the gate wiring region. Subsequently, as shown in FIG. 22C, the insulation film 420b of the gate electrode region is removed by the RIE, CDE, wet etching using an HF solution or the like using the resist mask 430. As a result, the surface of the substrate 421 of the gate electrode region is exposed.

As shown in FIG. 22D, the resist mask 430 is then removed by an asher or SH treatment (treatment with a mixed solution of sulfuric acid and hydrogen peroxide). Thereafter, as shown in FIG. 22E, the gate insulation film 420a is formed on the substrate 421 through the oxidation in an oxygen atmosphere for 30 minutes at 950° C.

As shown in FIG. 22F, a conductive thin film 423 is formed which consists of a semiconductor thin film or a metal thin film which will be a gate electrode 423a and a gate wiring 423b. It is better to remove the stepped portion formed on the thin film by polishing. It is preferable that an insulation film such as a nitride film be formed on the thin film.

As shown in FIG. 22G, a resist mask 430 is formed so as to cover the MOS transistor formation region. Subsequently, as shown in FIG. 22H, the conductive thin film 423 not covered with the resist 430 is removed by the anisotropic etching, to expose the gate insulation films 420b and 420a.

After the surface of the substrate 421 is exposed by etching the gate insulation films 420a and 420b, the substrate 421 is further etched to the depth required for element isolation. In this manner, a depressed portion is formed. Then, the resist 430 is removed as shown in FIG. 22J.

As shown in FIG. 22K, an insulation film 422 serving as an element isolation film, is deposited over the entire surface. For example, in the case where the etching amount (depth) of the substrate is 2 μm, the thickness of the gate insulation film is 100 nm, and the thickness of the conductive thin film 423 is 400 nm, an oxide film serving as the insulation film 422 is formed in a thickness of 2.5 μm or more from TEOS (tetraethylorthosilicate).

As shown in FIG. 22L, the insulation film 422 on the conductive thin film 423 is removed by polishing. As a result, the insulation film 422 is allowed to remain selectively in the depressed portion formed in the substrate surface by etching. In this manner, a buried element isolation film 422 is formed.

As shown in FIG. 22M, the conductive thin film 423 and the gate oxide film 420a are removed by use of the resist mask 430. The etching may be stopped at the time the gate oxide film 420*a* is exposed and the gate oxide film 420*a* is removed by another etching using e.g. HF.

When the source/drain or the gate of another MOS transistor (not shown) is connected to the source/drain or the gate of the transistor mentioned above, the conductive thin film serving as wiring may be left, as shown in Embodiments 7 and 8.

As shown in FIG. 22N, after the resist mask 430 is removed, the conductive thin film 423 is etched until the substrate 421 of the source/drain layers 425 and 426 formation region is exposed, thereby forming the gate electrode 423*a* and the gate wiring 423*b*.

As shown in FIG. 22O, an insulation film 428 is formed over the entire film. Thereafter, as shown in FIG. 22P, the entire surface of the insulation film 428 is etched by anisotropic etching to form a side-wall gate insulation film 428*s*. Then, the substrate 421 of the source/drain region is etched to the depth where a PN junction is to be formed.

As shown in FIG. 22Q, an impurity-doped semiconductor film 427 is deposited over the entire surface. Subsequently, as shown in FIG. 22R, the semiconductor film 427 on the element isolation film 422, on the gate electrode 423*a* and on the gate wiring 423*b* is removed. The semiconductor film 427 remaining in the source/drain region will serve as the source layer 425 and the drain layer 426.

As shown in FIG. 22S, an insulation film 429 is deposited over the entire surface. Thereafter, a resist mask 430 is formed as shown in FIG. 22T. Then, a contact hole 433 is formed by the RIE method. The contact hole 433 is required for connecting the source/drain layers 425, 426 to the upper layer wiring 432 and connecting the gate electrode 423 and the upper-layer wiring 432. The contact hole 433 is arranged in a different position from the gate wiring 423*b* to avoid a short circuit due to misalignment.

Finally, as shown in FIG. 22U, after the resist mask 430 is removed, the upper-layer wiring 432 is formed of aluminium or the like, and then, the gate contact 432*g*, source contact 432*s*, drain contact 432*d* are formed. In FIG. 22U, only the insulation film 429 should be seen except for the upper wiring 432, however, FIG. 22U shows the construction uncovered with the insulation film 429 for facilitating understanding.

In the aforementioned manufacturing method, the substrate surface is etched to form a depressed portion in the stage shown in FIG. 22M and an impurity containing semiconductor film is buried in the depressed portion to form a source/drain layer. In this case, the source/drain layer may be formed by injecting impurity ions to the substrate surface instead of etching it. In the case of ion implantation, a metal film may be used as the conductive layer 427 to be buried in the source/drain region in the stage of FIG. 22R.

Figure 23A:
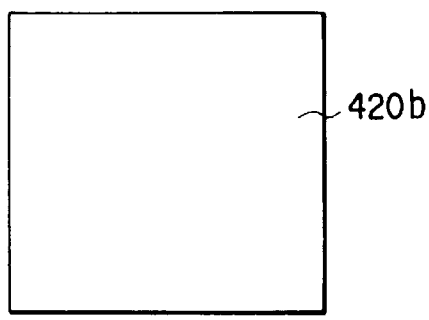
FIGS. 23A to 23X are plan views of a transistor sequentially showing the details of a formation method of the MOS transistor shown in FIGS. 20A and 20B.
Figure 23E:
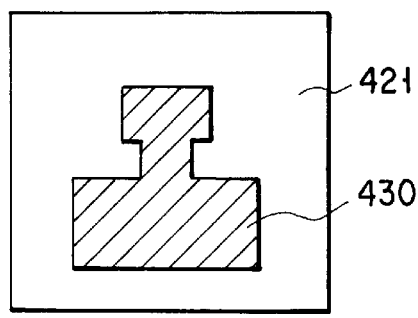
Figure 23B:
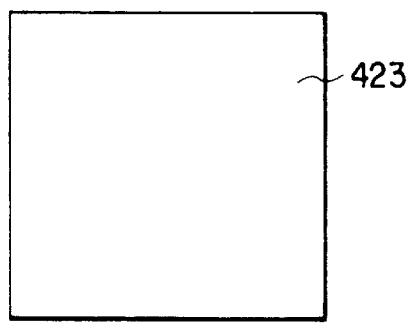
Figure 23F:
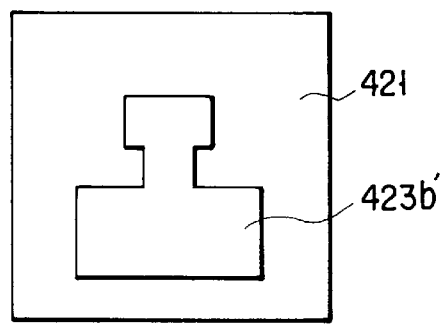
Figure 23C:
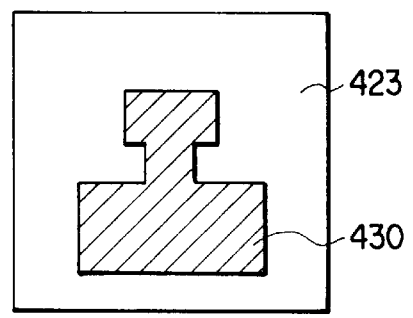
Figure 23G:
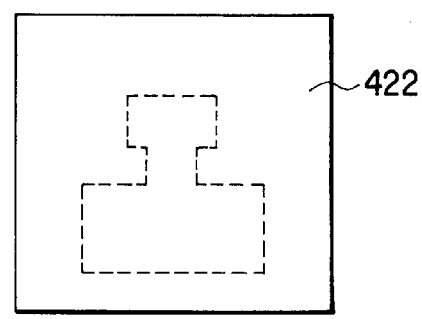
Figure 23D:
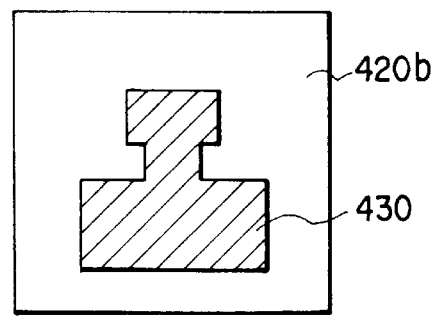
Figure 23H:
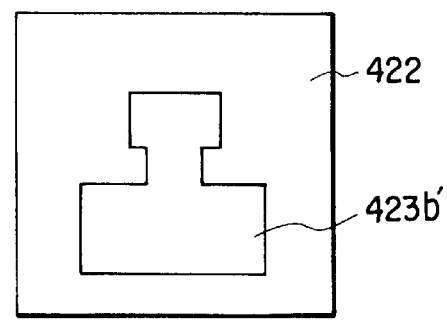
Figure 23I:
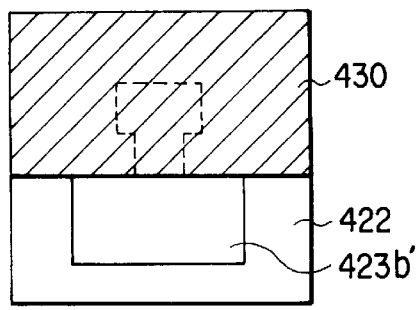
Figure 23M:
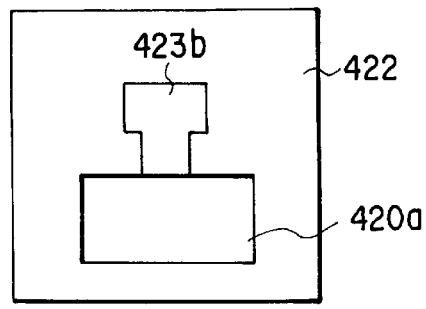
Figure 23J:
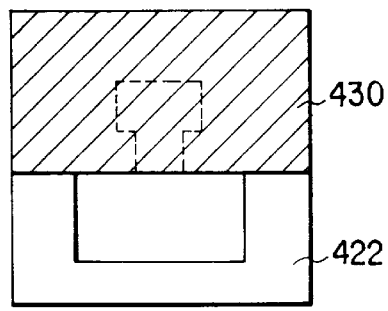
Figure 23N:
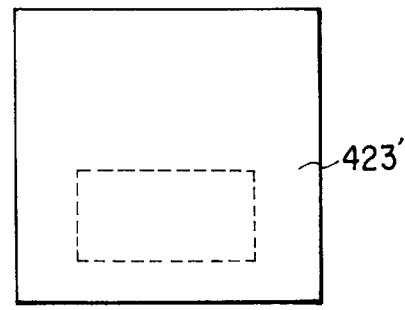
Figure 23K:
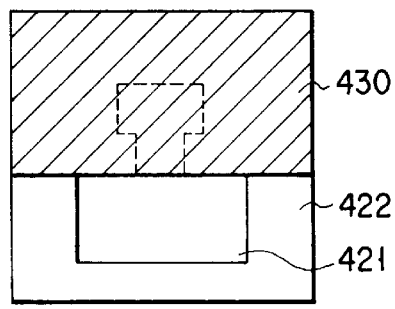
Figure 23O:
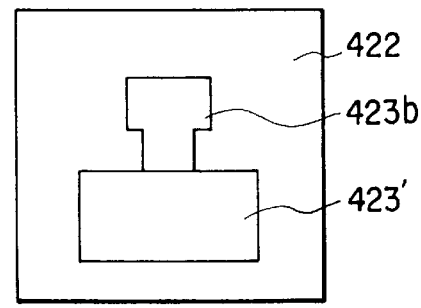
Figure 23L:
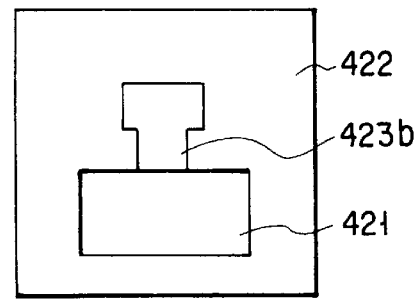
Figure 23P:
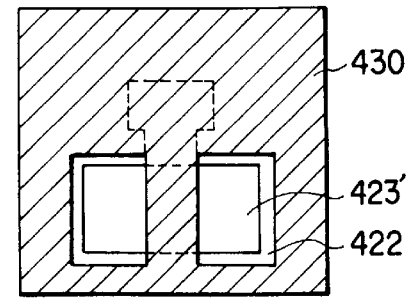
Figure 23Q:
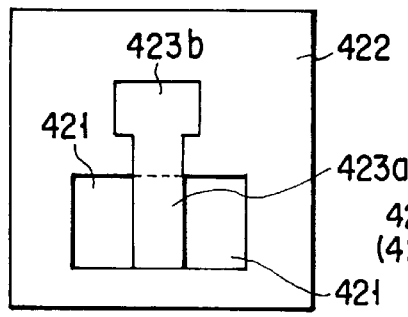
Figure 23U:
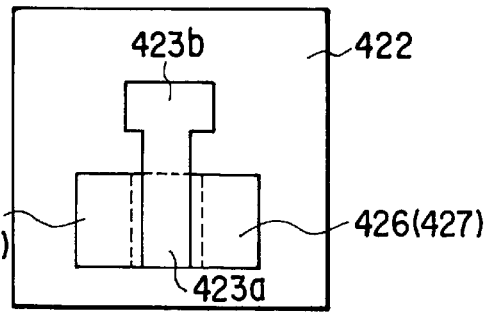
Figure 23R:
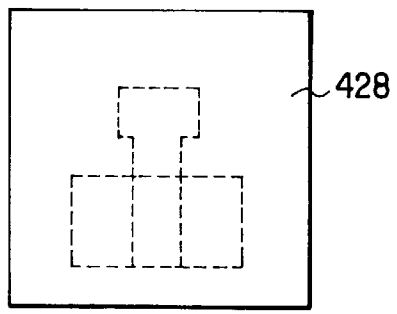
Figure 23V:
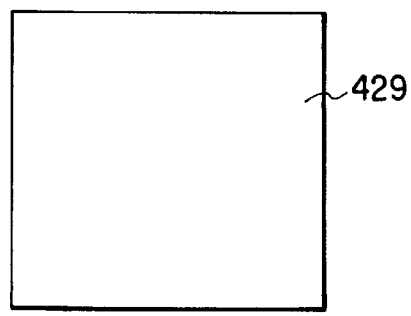
Figure 23S:
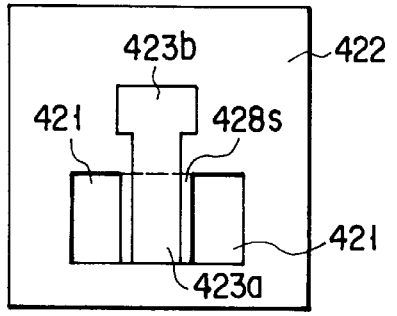
Figure 23W:
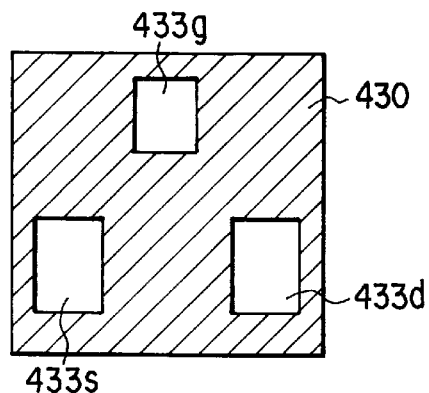
Figure 23T:
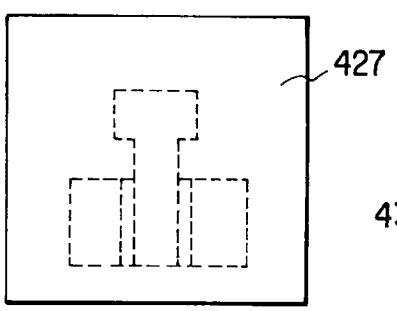
Figure 23X:
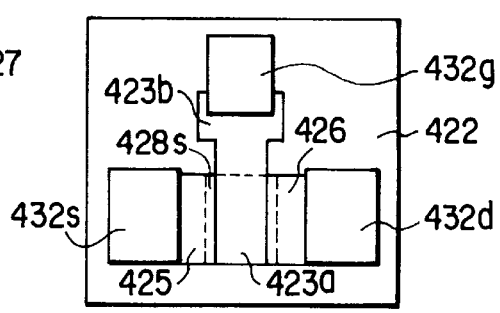

FIGS. 23A–23X are plan views of a transistor, sequentially showing the details of the method explained in FIGS. 20A and 20B.

As shown in FIG. 23A, the thicker gate insulation film 420*b* (e.g., 100 nm) is formed on a silicon substrate (not shown) by means of the CVD method, the thermal oxidation method, or the like. Thereafter, as shown in FIG. 23B, a conductive thin film 423 (which is made of semiconductor thin film or metal thin film) is formed on the insulation film 420*b*.

As shown in FIG. 23C, the resist mask 430 is formed in the MOS transistor formation region. Subsequently, as shown in FIG.23D, the conductive thin film 423 except for the MOS transistor formation region is etched by the anisotropic etching using the resist mask 430 as a mask. As a result, gate insulation film 420*b* is exposed.

As shown in FIG. 23E, the insulation film 420*b* is etched by using the resist mask 430 as a mask to expose the substrate 421. Thereafter, the substrate 421 is further etched to a depth required for a depressed portion of an element isolation groove. Then, as shown in FIG. 23F, the resist mask 430 is removed to form a conductive thin film 423*b'* which will serve as a gate wiring.

As shown in FIG. 23G, the insulation film 422 serving as a buried element isolation film is deposited over the entire surface. If the etching amount (depth) of the substrate 421 is 2 μm, the thickness of the thick insulation film 420*b* is 0.5 μm, and the thickness of the conductive thin film 423*b'* is 0.5 μm, an oxide film serving as the insulation film 422 (3 it m or more) is formed by depositing TEOS (tetraethylorthosilicate) and buried in the depressed portion. Subsequently, as shown in FIG. 23H, the insulation film 422 on the conductive thin film 423*b'* is removed by polishing the entire surface. Consequently, the buried element isolation film 422 whose surface is present in the same plane as the conductive thin film is formed 423*b'*.

As shown in FIG. 23I, the resist mask 430 is formed in a wiring formation region which will be the gate wiring 423*b*. Subsequently, as shown in FIG. 23J, the conductive thin film 423*b'* of the wiring formation region, which will be the gate wiring 423*a*, is removed by anisotropic etching, CDE or the like. As a result, the substrate 421 is exposed as shown in FIG. 23K. Thereafter, the resist mask 430 is removed by an asher or SH treatment (treatment with a mixed solution of sulfuric acid and hydrogen peroxide) as shown in FIG. 23L. The gate wiring 423B is provided in this step.

As shown in FIG. 23M, the gate oxide film 420*a* is formed on the substrate 421 which has been exposed by oxidation in an oxygen atmosphere for 30 minutes at 950° C. Subsequently, as shown in FIG. 23N, the conductive thin film 423', which will be the gate electrode, is deposited over the entire surface. It is preferred that an insulation film such as a nitride film be formed on the conductive thin film 423'.

As shown in FIG. 23O, the conductive thin film 423' on the element isolation film 422 is removed by polishing. Thereafter, as shown in FIG. 23P, the conductive thin film 423' on the source/drain layer formation region is removed by using a resist mask 430. Consequently, the gate electrode 423*a* is formed. In this case, the etching may be stopped at the stage in which a gate oxide film 420*a* is exposed and the gate oxide film 420*a* may be removed by another etching using e.g. HF.

When the source/drain or the gate of another MOS transistor (not shown) is connected to the source/drain or the gate of the transistor mentioned above, the semiconductor film or the conductive film serving as wiring may be left as shown in Embodiments 7 and 8.

As shown in FIG. 23Q, the resist mask 430 is removed and the conductive thin film 423' is etched until the substrate 421 of the source/drain layer formation region is exposed.

As shown in FIG. 23R, the insulation film 428 is deposited over the entire surface. Subsequently, as shown in FIG. 23S, the entire surface of the insulation film 428 is etched by anisotropic etching, to form the side wall gate insulation film 428*s*. Thereafter, the substrate of the source/drain formation region is etched to the depth where a PN junction is formed.

As shown in FIG. 23T, the semiconductor film 427 is formed over the entire surface. Subsequently, as shown in FIG. 23U, the semiconductor film 427 on the element isolation film 422 and the gate electrode 423 is removed by polishing. As a result, the source/drain layers 425 and 426 are formed.

As shown in FIG. 23V, the insulation film 429 is formed over the entire substrate. Thereafter, as shown in FIG. 23W, a resist mask 430 is formed. Then, contact holes 433s and 433d required for the connection between the source/drain layers 425, 426 and the upper-layer wiring and contact hole 433g required for the connection between the gate wiring 423b and the upper layer wiring are formed by the reactive ion etching, or the like. The contact hole 433g for gate contact is arranged in a different position from the gate wiring 423b to avoid a short circuit due to misalignment.

Finally, as shown in FIG. 23X, after the resist mask is removed, the upper layer wiring (contact) made of aluminium or the like is formed, and then, the gate contact 432g, a source contact 432s, and drain contact 432d are formed. In FIG. 23X, only the insulation film 429 is visible except for the aforementioned contact; however, FIG. 23X shows the structure uncovered with insulation film 429 for facilitating the understanding.

In the aforementioned manufacturing method, the substrate surface is etched to form a depressed portion in the stage shown in FIG. 23Q and an impurity-containing semiconductor film is buried in the depressed portion to form a source/drain layer. In this case, the source/drain layer may be formed by injecting impurity ions into the substrate surface instead of etching it. In the case of the ion implantation, a metal film may be used as the conductive layer 427 to be buried in the source/drain region in the stage of FIG. 23T.

The present invention is not limited to the aforementioned embodiments. Although a silicon substrate is used in the embodiments, another semiconductor substrate such as a GaAs substrate may be used. The present invention may be modified in various ways within the scope of the present invention.

As is described above, according to a first aspect of the present invention, a conductive film for reducing the resistance of the source/drain region can be buried by polishing in a self-alignment manner. Since silicon is not consumed in the method of the present invention, unlike the silicide technique, the source/drain layer will not be destroyed even if the junction of the source/drain layer is shallow. Hence, even if the junction of the source/drain layer is shallow, the resistance of the source/drain can be sufficiently reduced by the conductive film of the present invention.

According to a second aspect of the present invention, a semiconductor film or a conductive film formed over the entire surface can be left selectively in an opening (source/drain layer) by polishing in a self-alignment manner. Hence, a semiconductor film or the like can be isolated at the gate portion without fail and a miniaturized source/drain layer can be formed even if the gate length is formed in the lowermost dimensions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:
   a semiconductor substrate having an element region on a surface thereof;
   an element isolation film formed on the surface of the semiconductor substrate so as to surround the element region;
   a gate portion crossing the element region and extending over the semiconductor substrate, the gate portion comprising at least a gate insulation film formed on the semiconductor substrate, a gate electrode formed on the gate insulation film, and a side-wall insulation film covering a side-wall thereof;
   source/drain regions formed in the surface of the element region on both sides of the gate portion; and
   a conductive film formed of one member selected from the group consisting of an alloy of a semiconductor material constituting the semiconductor substrate and a transition metal and the semiconductor material which is impurity-doped, the conductive film being formed on each of the source/drain regions so as to be embedded in a region between the gate portion and the element isolation film and electrically isolated from the gate electrode by the side-wall insulation film,
   wherein an upper surface of the element isolation film is formed in substantially the same plane as an upper surface of the gate portion.

2. The semiconductor device according to claim 1, wherein the gate electrode is formed of a polycrystalline silicon and the gate portion further comprises a refractory metal film formed on the gate electrode and an upper surface of the refractory metal film is formed in substantially the same plane as the upper surface of the element isolation film.

3. The semiconductor device according to claim 1, wherein the gate portion further comprises an upper insulation film on the gate electrode and an upper surface of the upper insulation film is in substantially the same plane as the upper surface of the element isolation film.

4. The semiconductor device according to claim 1, wherein at least part of the conductive film is formed in substantially the same plane as the upper surface of the gate portion.

5. The semiconductor device according to claim 1, further comprising an interlayer insulation film formed on the conductive film, wherein an upper surface of the interlayer insulation film is formed in substantially the same plane as an upper surface of the element isolation film.

6. The semiconductor device according to claim 1, wherein the semiconductor substrate is a single crystal semiconductor substrate and the conductive film is an epitaxially-grown film made of the alloy of the semiconductor material constituting the semiconductor substrate and the transition metal.

7. The semiconductor device according to claim 1, wherein the semiconductor substrate is formed of silicon, the conductive film is formed of silicon containing an impurity, and a concentration of the impurity contained in the conductive film is larger than the solid solubility of silicon.

8. A semiconductor device comprising:
   a semiconductor substrate having an element region on a surface thereof;
   an element isolation film formed on the surface of the semiconductor substrate so as to surround the element region;
   a gate portion crossing the element region and extending over the semiconductor substrate, the gate portion comprising at least a gate insulation film formed on the semiconductor substrate, a gate electrode formed on the gate insulation film, an upper insulation film formed on the gate electrode and a side-wall insulation film formed on a side-wall of the gate electrode; and source/drain regions formed on a surface of the element region on both sides of the gate portion so as to be embedded in a region between the element isolation film and the gate portion, wherein an upper surface of the element isolation film and at least part of upper surfaces of the source/drain regions are formed in substantially the same plane as an upper surface of the gate portion.

9. The semiconductor device according to claim 8, wherein the semiconductor substrate is formed of silicon, the source/drain regions are formed of silicon containing an impurity, and a concentration of the impurity contained in the source/drain regions is larger than the solid solubility of silicon.

10. The semiconductor device according to claim 8, wherein the element isolation region is formed such that a construct having the same structure as that of the gate portion is formed on an insulation film.

11. The semiconductor device according to claim 8, wherein the surface of the substrate on which the source/drain regions are formed is slightly etched so as to engrave the surface of the substrate under the side-wall insulation film.

* * * * *